United States Patent
Nishi et al.

(10) Patent No.: US 8,450,208 B2
(45) Date of Patent: May 28, 2013

(54) SEMICONDUCTOR DEVICE MANUFACTURING METHOD

(75) Inventors: Yoshifumi Nishi, Kanagawa (JP); Atsuhiro Kinoshita, Kanagawa (JP); Hirotaka Nishino, Kanagawa (JP); Masamichi Suzuki, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 47 days.

(21) Appl. No.: 13/081,629

(22) Filed: Apr. 7, 2011

(65) Prior Publication Data

US 2012/0077341 A1 Mar. 29, 2012

(30) Foreign Application Priority Data

Sep. 29, 2010 (JP) ................... 2010-218383

(51) Int. Cl.
*H01L 21/283* (2006.01)
(52) U.S. Cl.
USPC .................................. 438/658; 257/E21.159
(58) Field of Classification Search
USPC ......................................................... 438/658
See application file for complete search history.

(56) References Cited

U.S. PATENT DOCUMENTS

| | | | |
|---|---|---|---|
| 6,150,243 A | 11/2000 | Wieczorek et al. | |
| 7,528,058 B2 | 5/2009 | Mantl et al. | |
| 7,642,165 B2 | 1/2010 | Shingu et al. | |
| 7,750,332 B2 | 7/2010 | Sakamoto et al. | |
| 2005/0127524 A1 | 6/2005 | Sakamoto et al. | |
| 2006/0099782 A1* | 5/2006 | Ritenour | 438/542 |
| 2006/0275968 A1* | 12/2006 | Mantl et al. | 438/197 |
| 2007/0269976 A1* | 11/2007 | Futase et al. | 438/637 |
| 2010/0109099 A1* | 5/2010 | Nishi et al. | 257/412 |
| 2010/0213531 A1* | 8/2010 | Asami et al. | 257/316 |
| 2010/0219478 A1* | 9/2010 | Manabe et al. | 257/369 |
| 2011/0012178 A1* | 1/2011 | Sugiyama et al. | 257/288 |
| 2011/0169059 A1* | 7/2011 | Clendenning et al. | 257/288 |

FOREIGN PATENT DOCUMENTS

| | | |
|---|---|---|
| JP | 62-231175 | 1/1987 |
| JP | 2007-534136 | 11/2007 |
| JP | 2010-109122 | 5/2010 |
| WO | 03094227 | 11/2003 |

OTHER PUBLICATIONS

Japanese Office Action for Japanese Application No. 2010-218383 mailed on Oct. 2, 2012.

* cited by examiner

*Primary Examiner* — Alexander Ghyka
*Assistant Examiner* — Stanetta Isaac
(74) *Attorney, Agent, or Firm* — Turocy & Watson, LLP

(57) ABSTRACT

In a semiconductor device manufacturing method according to an exemplary embodiment, a sulfur-containing film containing sulfur is deposited on an n-type semiconductor, a first metal film containing a first metal is deposited on the sulfur-containing film, a heat treatment is performed to form a metal semiconductor compound film by reacting the n-type semiconductor and the sulfur-containing film, and to introduce sulfur to an interface between the n-type semiconductor and the metal semiconductor compound film being formed.

19 Claims, 33 Drawing Sheets

SEMICONDUCTOR DEVICE MANUFACTURING METHOD

CROSS-REFERENCE TO RELATED APPLICATION

This application is based upon and claims the benefit of priority from Japanese Patent Application No. 2010-218383, filed on Sep. 29, 2010, the entire contents of which are incorporated herein by reference.

FIELD

Embodiments described herein relate generally to a semiconductor device manufacturing method.

BACKGROUND

In various semiconductor devices, it is necessary to reduce a contact resistance between a semiconductor and a metal semiconductor compound electrode. For example, in order to reduce the contact resistance, there is a method of forming a high-concentration dopant layer near an interface between the semiconductor and the metal semiconductor compound electrode by ion implantation or epitaxial growth.

For example, in a power MOSFET (Metal Oxide Semiconductor Field Effect Transistor) that is of a semiconductor switch driven at a high breakdown voltage, it is necessary to maintain a carrier concentration at a low level in order to increase an breakdown voltage of the device.

In the method of forming the high-concentration dopant layer, such as ion implantation or epitaxial growth, the impurity diffuses in a low-concentration substrate by a subsequent process, which may results in a decrease of the breakdown voltage of the device. And also, the formation of the high-concentration impurity layer by the ion implantation or the epitaxial growth causes an increase of process cost of the device.

There is well known a method, in which a non-dopant impurity such as sulfur is introduced by the ion implantation to lower a Schottky barrier height and the contact resistance between the semiconductor and the metal semiconductor compound electrode is reduced.

DETAILED DESCRIPTION

Figure 1A:
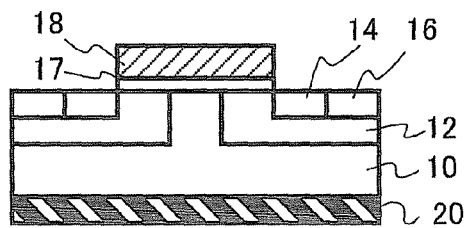
FIG. 1A to FIG. 1E are process sectional views illustrating a semiconductor device manufacturing method according to a first embodiment.

In a semiconductor device manufacturing method according to an exemplary embodiment, a sulfur-containing film containing sulfur is deposited on an n-type semiconductor, a first metal film containing a first metal is deposited on the sulfur-containing film, a heat treatment is performed to form a metal semiconductor compound film by reacting the n-type semiconductor and the sulfur-containing film, and to introduce sulfur to an interface between the n-type semiconductor and the metal semiconductor compound film being formed.

Embodiments of will be described below with reference to the drawings. In the drawings, the identical or similar constituent is designated by the identical or similar numeral.

(First Embodiment) In a semiconductor device manufacturing method according to a first embodiment, a sulfur-containing film containing sulfur is deposited on an n-type semiconductor. A first metal film containing a first metal is deposited on the sulfur-containing film. The n-type semiconductor and the first metal film are caused to react with each other by a heat treatment to form a metal semiconductor compound film, and sulfur is introduced to an interface between the n-type semiconductor and the metal semiconductor compound film by the heat treatment.

The manufacturing method of the first embodiment is applied to formation of a drain electrode of a vertical power MOSFET. A contact resistance of the drain electrode of the vertical power MOSFET can be reduced by the above-described configuration.

FIG. 1A to FIG. 1E are process sectional views illustrating the semiconductor device manufacturing method of the first embodiment.

For example, an n-type silicon (Si) substrate 10 in which antimony (Sb) is doped in a relatively low concentration is prepared. For example, preferably an n-type impurity concentration that is of a dopant is $3 \times 10^{18}$ cm$^{-3}$ or less in order to maintain a sufficient breakdown voltage.

A p-type well region 12, an n+-type source region 14, a p+-type well contact region 16, a gate insulator 17, and a gate electrode 18 are formed on an upper surface of the silicon substrate 10 by a well-known manufacturing method. An oxide film 20 such as a native oxide film or a protective oxide film is formed on a back side of the silicon substrate 10.

Figure 1E:
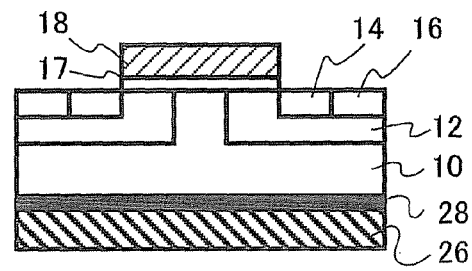
Figure 1B:
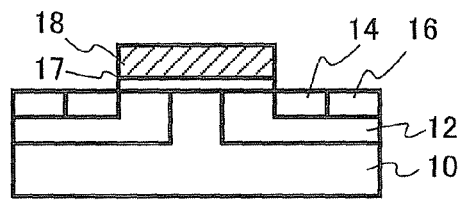

Then the oxide film 20 is removed by etching (FIG. 1B). For example, the etching is performed using hydrofluoric acid diluted with pure water.

Figure 1C:
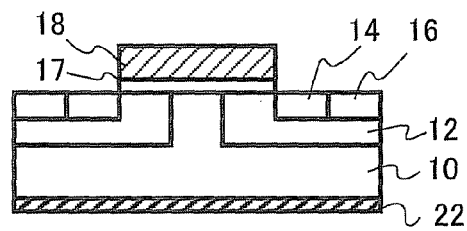

Then a sulfur-containing film 22 containing sulfur (S) is deposited on the backside of the silicon substrate 10 (FIG. 1C). The sulfur-containing film 22 is a thin nonmetal film made of such as a nickel sulfide (NiS), which contains sulfur and nickel.

For example, the sulfur-containing film 22 is deposited by an evaporation method or a sputtering method. Preferably, from the viewpoint of increasing production quantity, the sulfur-containing film 22 is formed by the sputtering method using a target made of the nickel sulfide that is of a stable compound.

For example, the sulfur-containing film 22 has a thickness of about 30 nm. Desirably the sulfur-containing film 22 has the thickness of 2 nm to 100 nm. When the sulfur-containing film 22 has the thickness less than 2 nm, there is a risk of insufficiently obtaining a contact resistance reduction effect of the drain electrode.

It is not always necessary that the sulfur-containing film 22 contain the metal. When the sulfur-containing film 22 contains the metal, desirably the metal is one of nickel (Ni), titanium (Ti), and cobalt (Co). This is because these metals easily react with the silicon substrate 10 to form a silicide.

Figure 1D:
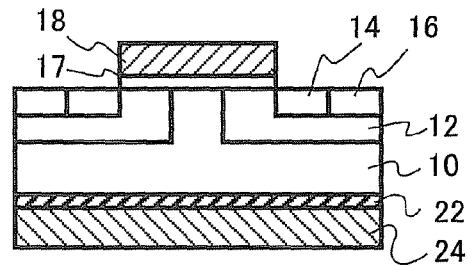

Then a first metal film 24 containing a first metal is deposited on the sulfur-containing film 22 (FIG. 1D). For example, the first metal film 24 is deposited by the evaporation method or the sputtering method. For example, the first metal film 24 is a nickel thin film. Desirably nickel, titanium or cobalt, which easily forms the silicide, is used as the first metal.

For example, the first metal film 24 has a thickness of about 60 nm.

When the sulfur-containing film 22 contains the metal, desirably the same metal as the first metal contained in the first metal film 24 is used from the viewpoint of process stability.

Then, for example, a heat treatment is performed by RTA (Rapid Thermal Annealing). The silicon substrate 10 is caused to react with the first metal film 24 to form a silicide film 26 by the heat treatment. An interface layer 28 to which sulfur atoms in the sulfur-containing film are introduced is also formed at an interface between the silicon substrate 10 and the silicide film 26 by the heat treatment (FIG. 1E).

In the interface layer 28, for example, the sulfur atoms (S) are segregated in a high concentration of $1 \times 10^{20}$ atoms/cm$^3$ or more.

For example, when the sulfur-containing film 22 contains sulfur and nickel while the first metal film 24 is a nickel film, the nickel silicide film 26 is formed, and the interface layer 28 containing the sulfur atoms is formed at the interface between the silicon substrate 10 and the nickel silicide film 26.

Desirably the heat treatment is performed at a temperature of 350° C. to 550° C. When the temperature is lower than 350° C., there is a risk that the reaction proceeds insufficiently. When the temperature exceeds 550° C., there is a risk that agglomeration of the silicide film occurs.

The silicide film 26 acts as the drain electrode of the vertical power MOSFET.

According to the semiconductor device manufacturing method of the first embodiment, the low-resistance metal semiconductor compound electrode can be formed on the n-type semiconductor substrate having the relatively low concentration of, for example, $1 \times 10^{19}$ cm$^{-3}$ or less using sulfur that is not a non-dopant. Accordingly, even in the vertical power MOSFET, the low-resistance metal semiconductor compound electrode can be formed while the breakdown voltage is not degraded by the dopant diffusion. The low-resistance metal semiconductor compound electrode can be formed with no use of expensive processes such as ion implantation and epitaxial growth. There is no risk of generating the element characteristic degradation caused by a crystal defect due to a damage of the ion implantation.

That the low contact resistance can be realized even in the low-concentration semiconductor by the manufacturing method of the first embodiment is attributed to the following reason. An interface state is formed near a conduction band of the n-type semiconductor by the existence of the high-concentration sulfur atoms at the interface between the n-type semiconductor and the metal semiconductor compound. Because Fermi level is pinned near the conduction band of the n-type semiconductor by the interface state, the Schottky barrier is lowered at the interface between the n-type semiconductor and the metal semiconductor compound.

Figure 2A:
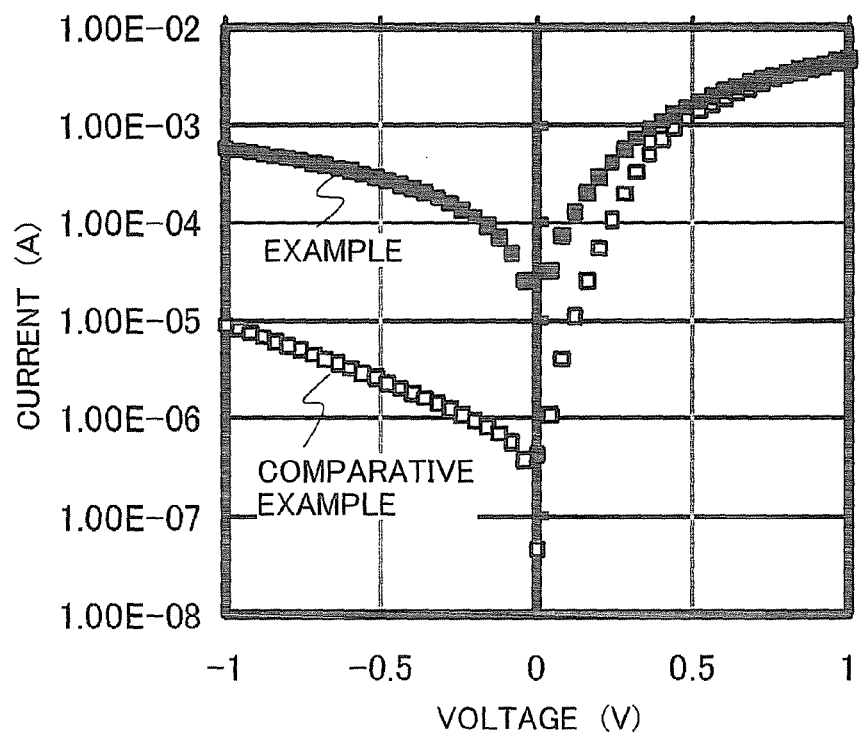
FIG. 2A and FIG. 2B are views illustrating a current-voltage characteristic between a semiconductor and a metal semiconductor compound of the semiconductor device manufactured by the method of the first embodiment.
Figure 2B:
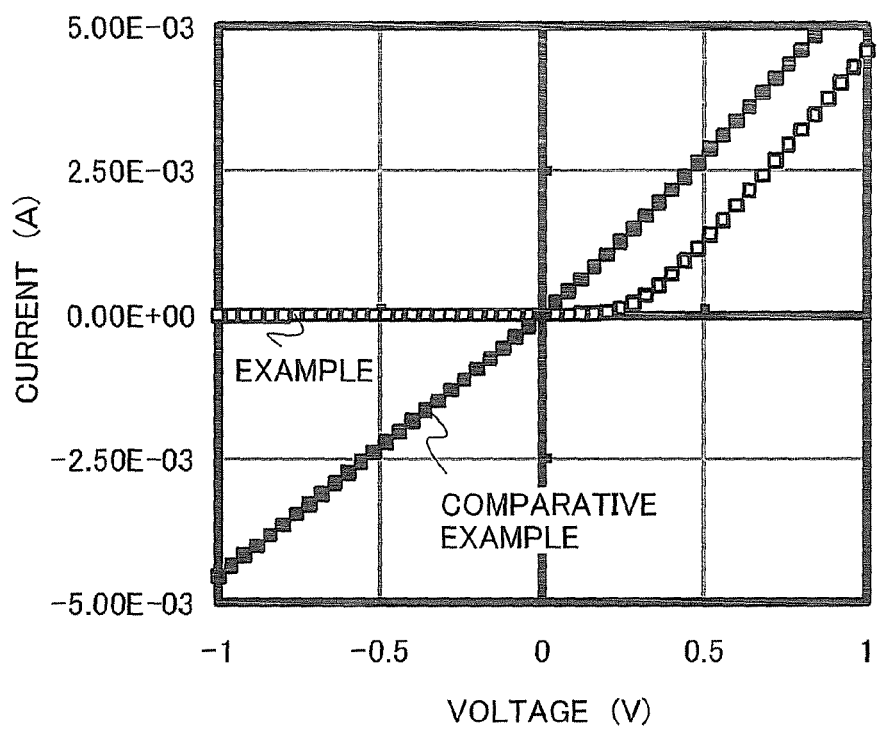

FIG. 2A and FIG. 2B are views illustrating a current-voltage characteristic between the semiconductor and the metal semiconductor compound of the semiconductor device manufactured by the method of the first embodiment. A vertical axis is indicated by logarithmic expression in FIG. 2A, and a vertical axis is indicated by linear expression in FIG. 2B.

A structure of the first embodiment of FIG. 2A and FIG. 2B is formed as follows. The film containing sulfur and nickel is deposited with the thickness of 30 nm on the silicon substrate having the n-type impurity concentration of $1\times10^{16}$ cm$^{-3}$ by the evaporation method in which the nickel sulfide (NiS) is used as the target, the nickel film is deposited with the thickness of 60 nm by the evaporation method in which nickel is used as the target, and the heat treatment is performed by the RTA at 500° C. for 10 minutes. A structure of a comparative example is formed similarly to the first embodiment except that the film containing sulfur and nickel is not deposited.

As is clear from FIG. 2A, according to the first embodiment, both a reverse (negative applied voltage side) current and a forward (positive applied voltage side) current increase, because the Schottky barrier is lowered compared with the comparative example. As is clear from FIG. 2B, an ohmic characteristic is realized in the first embodiment while a non-ohmic characteristic emerges prominently in the comparative example.

FIG. 3A to FIG. 3F are process sectional views illustrating a semiconductor device manufacturing method according to a modification of the first embodiment. The processes of the modification are similar to those of the first embodiment until the first metal film 24 containing the first metal is deposited on the sulfur-containing film 22 (FIG. 3A to FIG. 3D).

Figure 3A:
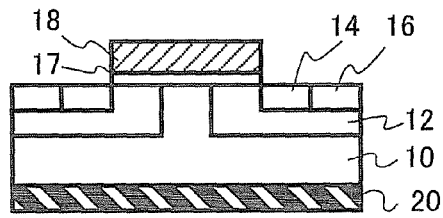
FIG. 3A to FIG. 3F are process sectional views illustrating a semiconductor device manufacturing method according to a modification of the first embodiment.
Figure 3E:
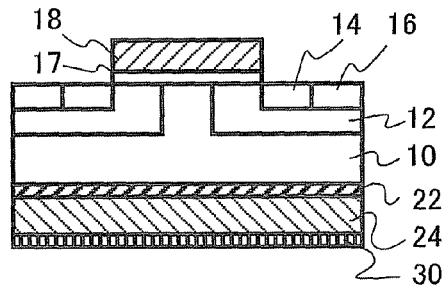
Figure 3B:
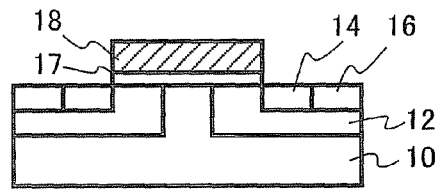

Then a second metal film 30 containing a second metal different from the first metal is deposited on the first metal film 24 (FIG. 3E).

Figure 3F:
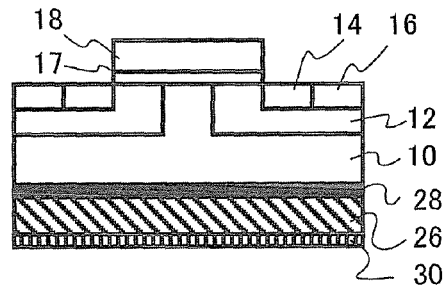
Figure 3C:
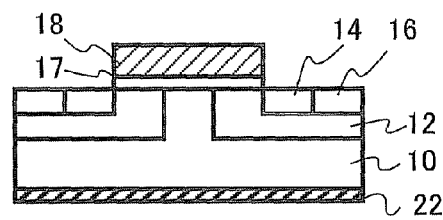
Figure 3D:
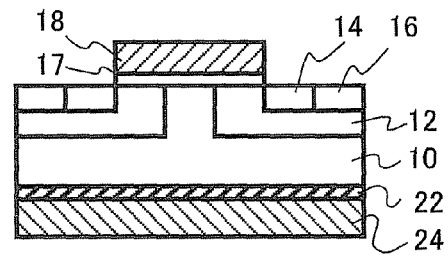

Then, for example, the heat treatment is performed by the RTA (Rapid Thermal Annealing). The silicon substrate 10 is caused to react with the first metal film 24 to form the silicide film 26 by the heat treatment. The interface layer 28 to which the sulfur atoms are introduced is also formed at the interface between the silicon substrate 10 and the silicide film 26 by the heat treatment (FIG. 3F).

The second metal film 30 acts as a cap film that prevents oxidation of sulfur in the sulfur-containing film 22 during the heat treatment and/or the outward diffusion of sulfur. Preferably the second metal has a silicidation temperature higher than that of the first metal. For example, preferably vanadium (V), molybdenum (Mo), titanium (Ti), zirconium (Zr), hafnium (Hf), tantalum (Ta), niobium (Nb), and a titanium nitride (TiN) are used as the second metal.

For example, the second metal film 30 has the thickness of about 30 nm.

Figure 4:
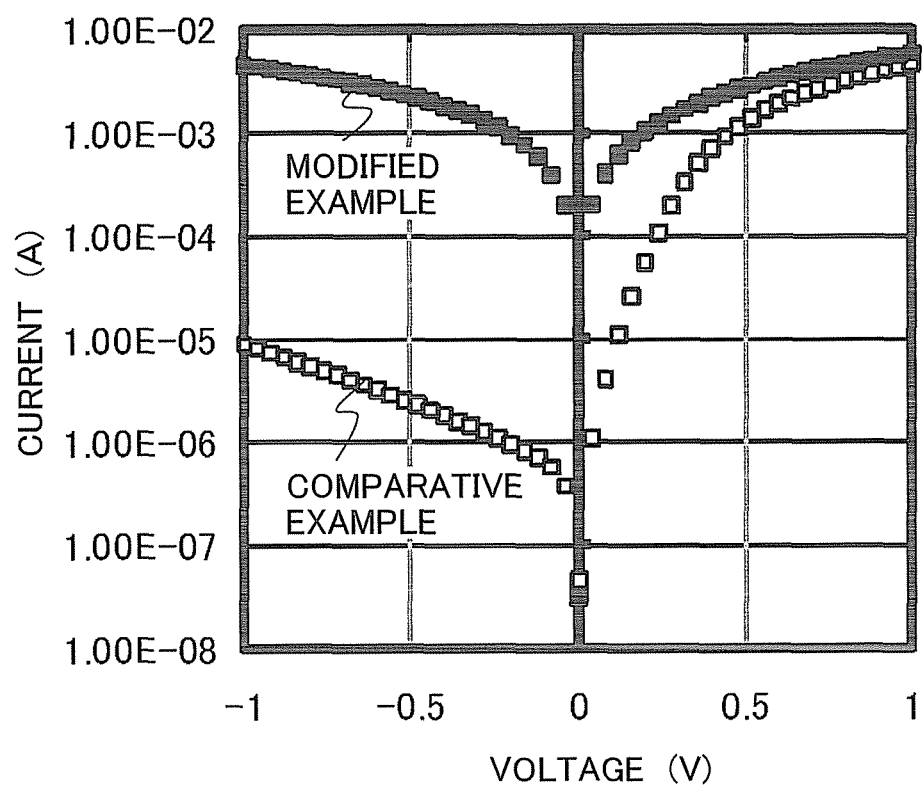
FIG. 4 is a view illustrating a current-voltage characteristic between a semiconductor and a metal semiconductor compound of the semiconductor device manufactured by the method of the modification of the first embodiment.

FIG. 4 is a view illustrating a current-voltage characteristic between the semiconductor and the metal semiconductor compound of the semiconductor device manufactured by the method of the modification of the first embodiment.

A structure of the modification of FIG. 4 is formed as follows. The film containing sulfur and nickel is deposited with the thickness of 30 nm on the silicon substrate having the n-type impurity concentration of $1\times10^{16}$ cm$^{-3}$ by the evaporation method in which the nickel sulfide (NiS) is used as the target, the nickel film is deposited with the thickness of 60 nm by the evaporation method in which nickel is used as the target, the titanium film is deposited with the thickness of 30 nm by the evaporation method in which titanium is used as the target, and the heat treatment is performed by the RTA at 500° C. for 10 minutes. A structure of a comparative example of FIG. 4 is similar to that of the comparative example of FIG. 2.

As is clear from FIG. 4, according to the modification, both the reverse (negative applied voltage side) current and the forward (positive applied voltage side) current increase, because the Schottky barrier is lowered compared with the comparative example. The current increased compared with the case having no cap film of FIG. 2A.

According to the modification of the first embodiment, the contact resistance between the n-type semiconductor and the metal semiconductor compound can be reduced.

(Second Embodiment) In a semiconductor device manufacturing method according to a second embodiment, a sulfur-containing film containing sulfur and a first metal is deposited on an n-type semiconductor, the n-type semiconductor and the sulfur-containing film are caused to react with each other by a heat treatment to form a metal semiconductor compound film, and sulfur is introduced to an interface between the n-type semiconductor and the metal semiconductor compound film by the heat treatment.

The second embodiment differs from the first embodiment in that the heat treatment is performed without depositing the metal film on the sulfur-containing film while the sulfur-containing film contains the metal. Contents overlapping those of the first embodiment are partially omitted.

FIG. 5A to FIG. 5D are process sectional views illustrating the semiconductor device manufacturing method of the second embodiment.

For example, the n-type silicon (Si) substrate 10 in which antimony (Sb) is doped in the relatively low concentration is prepared. For example, preferably the n-type impurity concentration that is of the dopant is $3\times10^{18}$ cm$^{-3}$ or less in order to maintain the breakdown voltage.

Figure 5A:
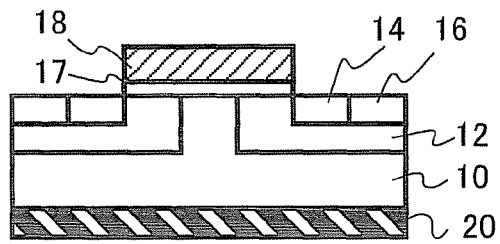
FIG. 5A to FIG. 5D are process sectional views illustrating a semiconductor device manufacturing method according to a second embodiment.

The p-type well region 12, the n+-type source region 14, the p+-type well contact region 16, and the gate electrode 18 are formed on the upper surface of the silicon substrate 10 by the well-known manufacturing method. The oxide film 20 such as the native oxide film or the protective oxide film is formed on the back side of the silicon substrate 10 (FIG. 5A).

Figure 5B:
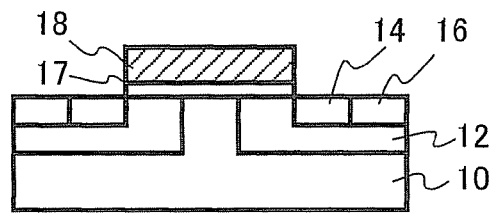

Then the oxide film 20 is removed by the etching (FIG. 5B). For example, the etching is performed using hydrofluoric acid diluted with pure water.

Figure 5C:
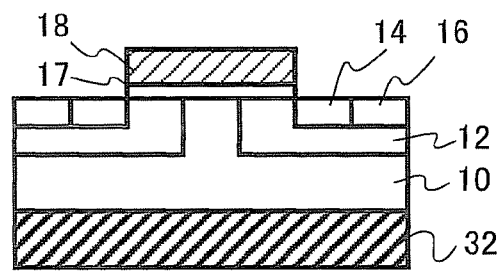

Then a sulfur-containing film 32 containing sulfur (S) and the first metal is deposited on the back side of the silicon substrate 10 (FIG. 5C). The sulfur-containing film 32 is a thin nonmetal film made of such as the nickel sulfide (NiS), which contains sulfur and nickel.

For example, the sulfur-containing film 32 is deposited by the evaporation method or the sputtering method. Preferably, from the viewpoint of increasing production quantity, the sulfur-containing film 32 is formed by the sputtering method using the target made of the nickel sulfide that is of the stable compound.

For example, the sulfur-containing film 32 has the thickness of about 30 nm. Desirably the sulfur-containing film 22 has the thickness of 2 nm to 100 nm. When the sulfur-containing film 32 has the thickness less than 2 nm, there is a risk of insufficiently obtaining the contact resistance reduction effect of the drain electrode.

Desirably nickel, titanium or cobalt, which easily forms the silicide, is used as the first metal.

Figure 5D:
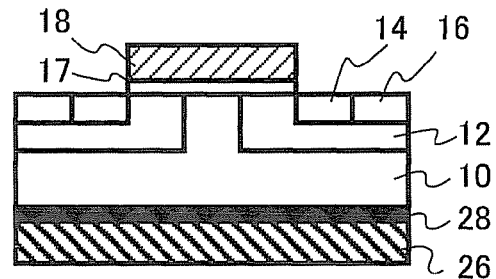

Then, for example, the heat treatment is performed by the RTA (Rapid Thermal Annealing). The silicon substrate 10 is caused to react with the sulfur-containing film 32 to form the silicide film 26 by the heat treatment. The interface layer 28 to which the sulfur atoms are introduced is also formed at the interface between the silicon substrate 10 and the silicide film 26 by the heat treatment (FIG. 5D).

For example, when the sulfur-containing film 22 is made of nickel sulfide (NiS), the nickel silicide film 26 is formed, and the interface layer 28 containing the sulfur atoms is formed at the interface between the silicon substrate 10 and the nickel silicide film 26. The sulfur atoms diffuse in the nickel silicide film 26 by the heat treatment to reach the interface.

Desirably the heat treatment is performed at a temperature of 350° C. to 550° C. When the temperature is lower than 350° C., there is a risk that the reaction proceeds insufficiently. When the temperature exceeds 550° C., there is a risk that the silicide film flocculates.

The silicide film 26 acts as the drain electrode of the vertical power MOSFET.

According to the semiconductor device manufacturing method of the second embodiment, the effect similar to that of the first embodiment is obtained. The reduction of production cost can be realized because the metal film depositing process can be eliminated.

Figure 6A:
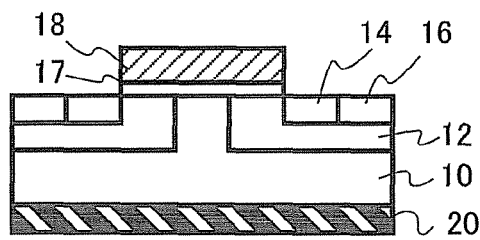
FIG. 6A to FIG. 6E are process sectional views illustrating a semiconductor device manufacturing method according to a modification of the second embodiment.
Figure 6E:
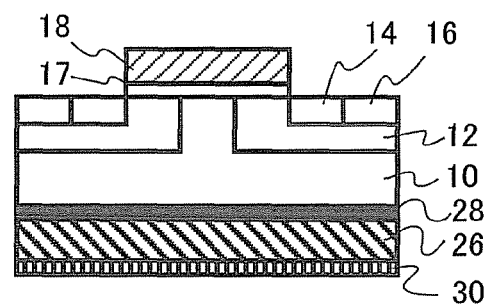
Figure 6B:
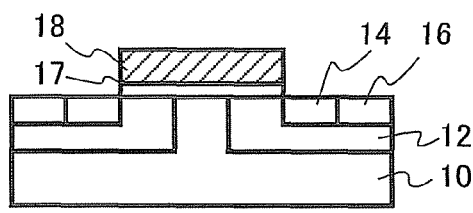
Figure 6C:
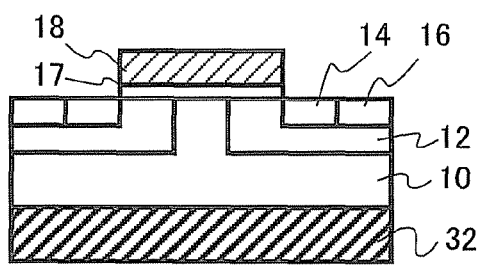

FIG. 6A to FIG. 6E are process sectional views illustrating a semiconductor device manufacturing method according to a modification of the second embodiment. The processes of the modification are similar to those of the second embodiment until the sulfur-containing film 32 is deposited (FIG. 6A to FIG. 6C).

Figure 6D:
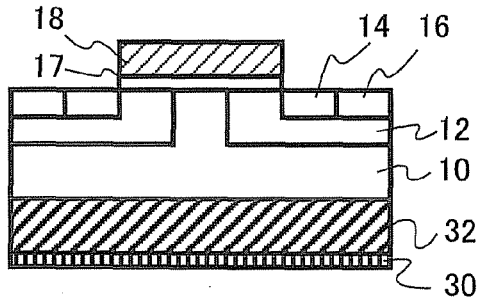

Then the second metal film 30 containing the second metal different from the first metal is deposited on the sulfur-containing film 32 (FIG. 6D). Then, for example, the heat treatment is performed by the RTA (Rapid Thermal Annealing). The silicon substrate 10 is caused to react with the sulfur-containing film 32 to form the silicide film 26 by the heat treatment. The interface layer 28 to which the sulfur atoms are introduced is also formed at the interface between the silicon substrate 10 and the silicide film 26 by the heat treatment (FIG. 6E).

The second metal film 30 acts as a cap film that prevents the oxidation of sulfur in the sulfur-containing film 22 during the heat treatment and/or the outward diffusion of sulfur. Preferably the second metal has a silicidation temperature higher than that of the first metal. For example, preferably vanadium (V), molybdenum (Mo), titanium (Ti), zirconium (Zr), hafnium (Hf), tantalum (Ta), niobium (Nb), and a titanium nitride (TiN) are used as the second metal.

For example, the second metal film 30 has the thickness of about 30 nm.

According to the modification of the second embodiment, the contact resistance between the n-type semiconductor and the metal semiconductor compound can be reduced.

(Third Embodiment) In a semiconductor device manufacturing method according to a third embodiment, a first metal film containing a first metal is deposited on an n-type semiconductor, the n-type semiconductor and the first metal film are caused to react with each other by a first heat treatment to form a metal semiconductor compound film, a sulfur-containing film containing sulfur is deposited on the metal semiconductor compound film, and sulfur is introduced to an interface between the n-type semiconductor and the metal semiconductor compound film by a second heat treatment.

The third embodiment differs from the first embodiment in that the sulfur-containing film containing sulfur is deposited after the metal semiconductor compound is formed and the heat treatment is further performed. Contents overlapping those of the first embodiment are partially omitted.

FIG. 7A to FIG. 7F are process sectional views illustrating the semiconductor device manufacturing method of the third embodiment.

For example, the n-type silicon (Si) substrate 10 in which antimony (Sb) is doped in the relatively low concentration is prepared. For example, preferably the n-type impurity concentration that is of the dopant is $3 \times 10^{18}$ cm$^{-3}$ or less in order to maintain the breakdown voltage.

Figure 7A:
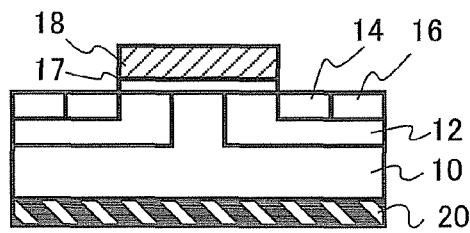
FIG. 7A to FIG. 7F are process sectional views illustrating a semiconductor device manufacturing method according to a third embodiment.

The p-type well region 12, the n+-type source region 14, the p+-type well contact region 16, and the gate electrode 18 are formed on the upper surface of the silicon substrate 10 by the well-known manufacturing method. The oxide film 20 such as the native oxide film or the protective oxide film is formed on the back side of the silicon substrate 10 (FIG. 7A).

Figure 7E:
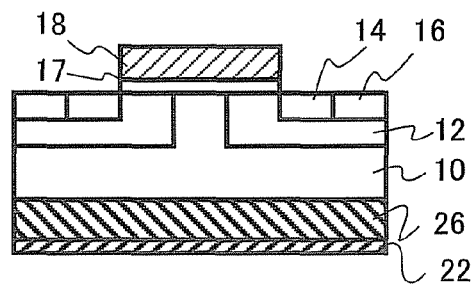
Figure 7B:
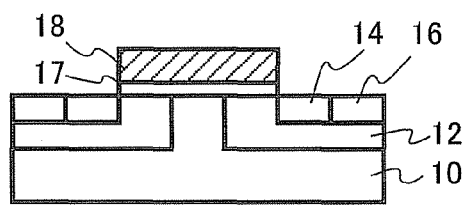

Then the oxide film 20 is removed by the etching (FIG. 7B). For example, the etching is performed using hydrofluoric acid diluted with pure water.

Figure 7F:
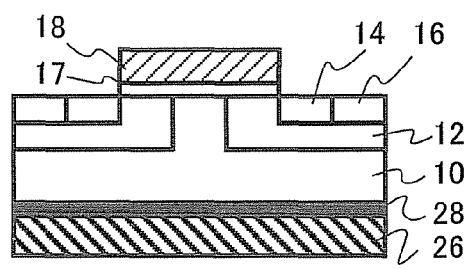
Figure 7C:
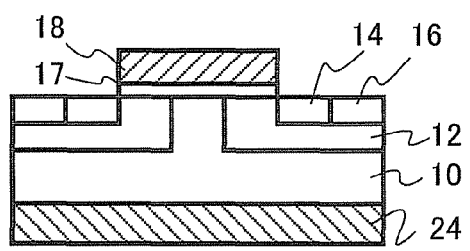

Then the first metal film 24 containing the first metal is deposited on the silicon substrate 10 (FIG. 7C). For example, the first metal film 24 is deposited by the evaporation method or the sputtering method. For example, the first metal film 24 is the nickel thin film. Desirably titanium or cobalt, which easily forms the silicide, is used as the first metal in addition to nickel.

For example, the first metal film 24 has the thickness of about 60 nm.

Figure 7D:
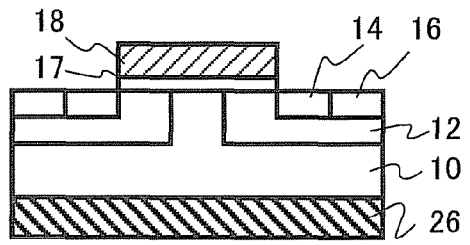

Then, for example, the first heat treatment is performed by the RTA (Rapid Thermal Annealing). The silicon substrate 10 is caused to react with the first metal film 24 to form the silicide film 26 by the first heat treatment (FIG. 7D).

For example, the nickel silicide film 26 is formed when the first metal film 24 is the nickel film.

Desirably the first heat treatment is performed at a temperature of 450° C. to 550° C. When the temperature is lower than 450° C., there is a risk that the reaction proceeds insufficiently. When the temperature exceeds 550° C., there is a risk that the silicide film flocculates.

Then the sulfur-containing film 22 containing sulfur (S) is deposited on the silicide film 26 (FIG. 7E). The sulfur-containing film 22 is a thin nonmetal film made of such as the nickel sulfide (NiS), which contains sulfur and nickel.

For example, the sulfur-containing film 22 is deposited by the evaporation method or the sputtering method. Preferably, from the viewpoint of increasing production quantity, the sulfur-containing film 22 is formed by the sputtering method using the target made of the nickel sulfide that is of the stable compound.

For example, the sulfur-containing film 22 has the thickness of about 30 nm. Desirably the sulfur-containing film 22 has the thickness of 2 nm to 100 nm. When the sulfur-containing film 22 has the thickness less than 2 nm, there is a risk of insufficiently obtaining the contact resistance reduction effect of the drain electrode.

It is not always necessary that the sulfur-containing film 22 contain the metal. When the sulfur-containing film 22 contains the metal, desirably the metal is one of nickel (Ni), titanium (Ti), and cobalt (Co). This is because these metals easily react with the silicon substrate 10 to form the silicide.

When the sulfur-containing film 22 contains the metal, desirably the same metal as the first metal contained in the first metal film 24 is used from the viewpoint of process stability.

Then, for example, the second heat treatment is performed by the RTA (Rapid Thermal Annealing). The interface layer 28 to which the sulfur atoms are introduced is formed at the interface between the silicon substrate 10 and the silicide film 26 by the second heat treatment (FIG. 7F).

For example, when the sulfur-containing film 22 contains sulfur and nickel while the first metal film 24 is the nickel film, the interface layer 28 containing the sulfur atoms is formed at the interface between the silicon substrate 10 and the nickel silicide film 26. The sulfur atoms diffuse in the nickel silicide film 26 by the heat treatment to reach the interface.

Desirably the second heat treatment is performed at a temperature of 450° C. to 550° C. When the temperature is lower than 450° C., there is a risk that the reaction proceeds insufficiently. When the temperature exceeds 550° C., there is a risk that the silicide film flocculates.

The silicide film 26 acts as the drain electrode of the vertical power MOSFET.

According to the semiconductor device manufacturing method of the third embodiment, the effect similar to that of the first embodiment is obtained.

FIG. 8A to FIG. 8G are process sectional views illustrating a semiconductor device manufacturing method according to a modification of the third embodiment. The processes of the modification are similar to those of the third embodiment until the sulfur-containing film 22 is deposited on the first metal film 24 (FIG. 8A to FIG. 8E).

Figure 8A:
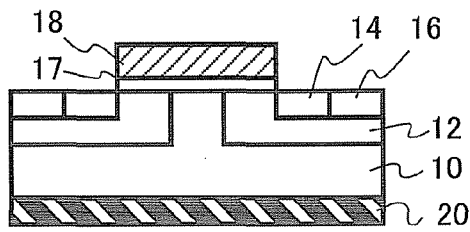
FIG. 8A to FIG. 8G are process sectional views illustrating a semiconductor device manufacturing method according to a modification of the third embodiment.
Figure 8E:
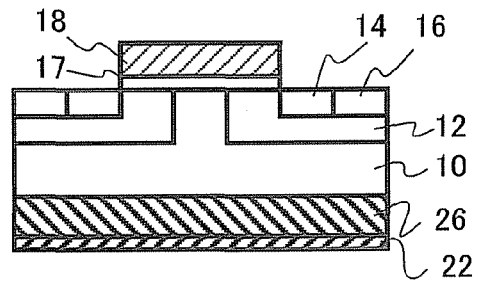
Figure 8B:
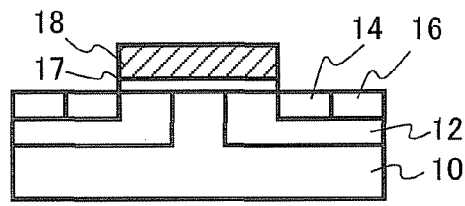
Figure 8F:
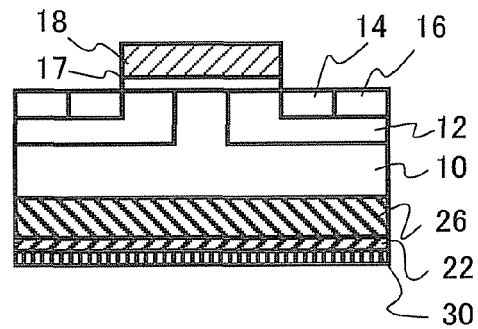
Figure 8C:
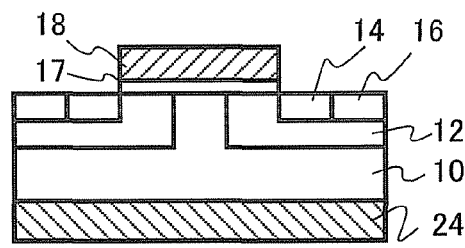
Figure 8G:
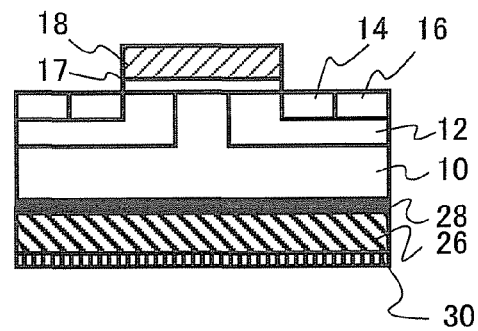
Figure 8D:
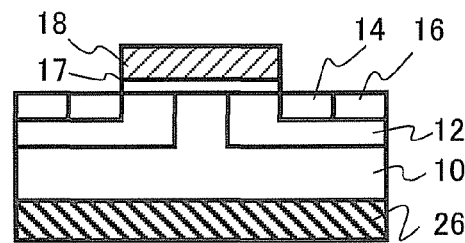

Then the second metal film 30 containing the second metal different from the first metal is deposited on the sulfur-containing film 22 (FIG. 8F). Then, for example, the second heat treatment is performed by the RTA (Rapid Thermal Annealing). The interface layer 28 to which the sulfur atoms are introduced is formed at the interface between the silicon substrate 10 and the silicide film 26 by the second heat treatment (FIG. 8G).

The second metal film 30 acts as a cap film that prevents the oxidation of sulfur in the sulfur-containing film 22 during the heat treatment or the outward diffusion of sulfur. Preferably the second metal has a silicidation temperature higher than that of the first metal. For example, preferably vanadium (V), molybdenum (Mo), titanium (Ti), zirconium (Zr), hafnium (Hf), tantalum (Ta), niobium (Nb), and a titanium nitride (TiN) are used as the second metal.

For example, the second metal film 30 has the thickness of about 30 nm.

Figure 9:
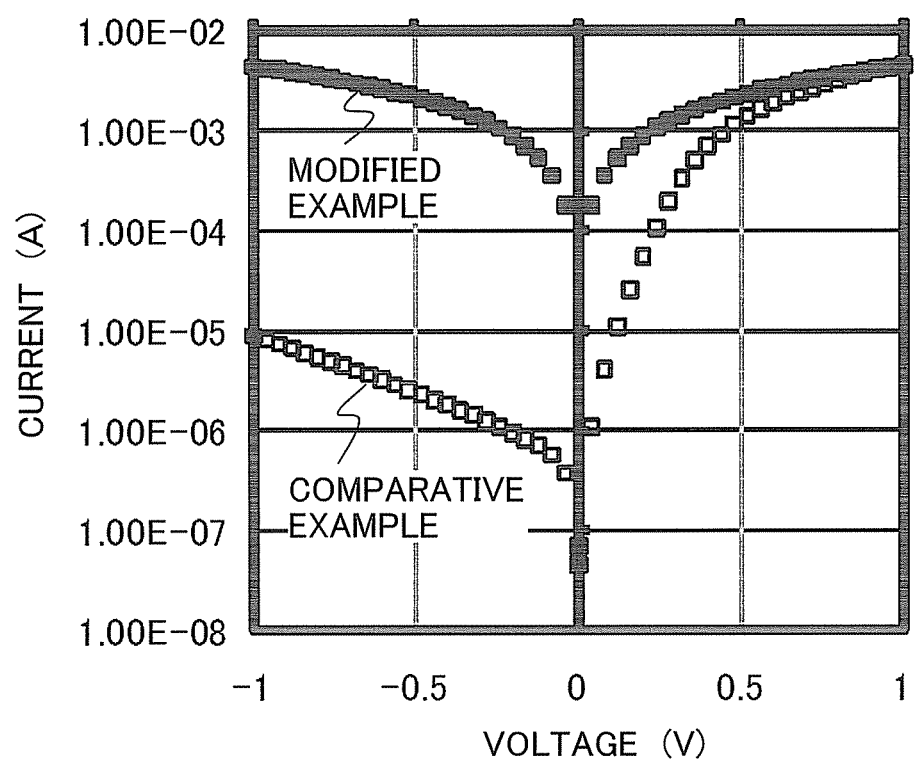
FIG. 9 is a view illustrating a current-voltage characteristic between a semiconductor and a metal semiconductor compound by the semiconductor device manufactured by the method of the modification of the third embodiment.

FIG. 9 is a view illustrating a current-voltage characteristic between a semiconductor and a metal semiconductor compound of the semiconductor device manufactured by the method of the modification of the third embodiment.

A structure of the modification of FIG. 9 is formed as follows. The nickel film is deposited with the thickness of 20 nm on the silicon substrate having the n-type impurity concentration of $1 \times 10^{16}$ cm$^{-3}$ by the evaporation method in which the nickel (Ni) is used as the target, the heat treatment is performed by the RTA at 450° C. for 10 minutes to form the nickel silicide film, the film containing sulfur and nickel is deposited with the thickness of 30 nm by the evaporation method in which the nickel sulfide is used as the target, the titanium film is deposited with the thickness of 30 nm by the evaporation method in which titanium is used as the target, and the heat treatment is performed by the RTA at 500° C. for 10 minutes. A structure of a comparative example of FIG. 9 is similar to that of the comparative example of FIG. 2.

As is clear from FIG. 9, according to the modification, both the reverse (negative applied voltage side) current and the forward (positive applied voltage side) current increase, because the Schottky barrier is lowered compared with the comparative example.

According to the modification of the third embodiment, the contact resistance between the n-type semiconductor and the metal semiconductor compound can be reduced.

(Fourth Embodiment) A semiconductor device manufacturing method according to a fourth embodiment differs from that of the first embodiment in that the semiconductor device manufacturing method of the fourth embodiment is applied to not the formation of the drain electrode of the vertical power MOSFET, but the formation of an n-side electrode of a pn diode. Contents overlapping those of the first embodiment are partially omitted.

FIG. 10A to FIG. 10E are process sectional views illustrating the semiconductor device manufacturing method of the fourth embodiment.

For example, an n-type silicon (Si) substrate 10 in which phosphorus (P) is doped in a relatively low concentration is prepared. For example, preferably the n-type impurity concentration that is of the dopant is $3 \times 10^{18}$ cm$^{-3}$ or less in order to maintain the breakdown voltage of the diode.

Figure 10A:
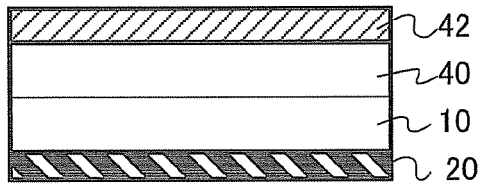
FIG. 10A to FIG. 10E are process sectional views illustrating a semiconductor device manufacturing method according to a fourth embodiment.

A p-type region 40 and a p-side electrode 42 are formed on the upper surface of the silicon substrate 10 by the well-known manufacturing method. The oxide film 20 such as the native oxide film or the protective oxide film is formed on the back side of the silicon substrate 10 (FIG. 10A).

Figure 10E:
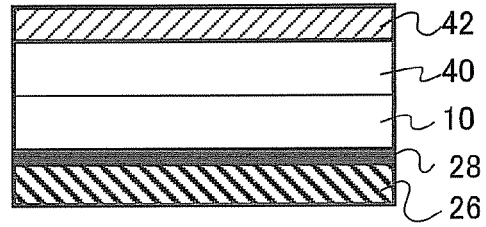
Figure 10B:
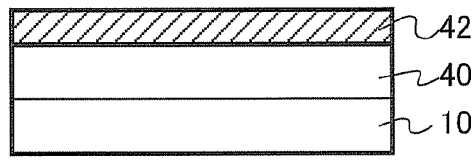

Then the oxide film 20 is removed by the etching (FIG. 10B).

Figure 10C:
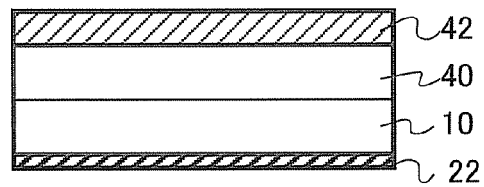

Then the sulfur-containing film 22 containing sulfur (S) is deposited on the back side of the silicon substrate 10 (FIG. 10C).

Figure 10D:
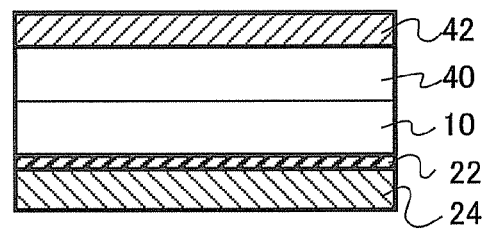

Then the first metal film 24 containing the first metal is deposited on the sulfur-containing film 22 (FIG. 10D).

Then, for example, the heat treatment is performed by the RTA (Rapid Thermal Annealing). The silicon substrate 10 is caused to react with the first metal film 24 to form the silicide film 26 by the heat treatment. The interface layer 28 to which the sulfur atoms are introduced is also formed at the interface between the silicon substrate 10 and the silicide film 26 by the heat treatment (FIG. 10E).

The silicide film 26 acts as the n-side electrode of the diode.

According to the semiconductor device manufacturing method of the fourth embodiment, the effect similar to that of the first embodiment is obtained for the formation of the metal semiconductor compound electrode. Accordingly, the high-reliability, high-breakdown-voltage diode is realized through the inexpensive process.

FIG. 11A to FIG. 11F are process sectional views illustrating a semiconductor device manufacturing method according to a modification of the fourth embodiment. The processes of the modification are similar to those of the fourth embodiment until the first metal film 24 containing the first metal is deposited on the sulfur-containing film 22 (FIG. 11A to FIG. 11D).

Figure 11A:
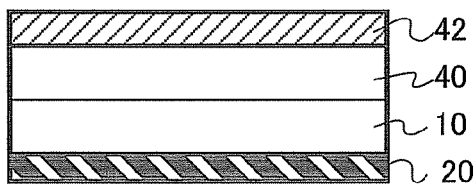
FIG. 11A to FIG. 11F are process sectional views illustrating a semiconductor device manufacturing method according to a modification of the fourth embodiment.
Figure 11B:
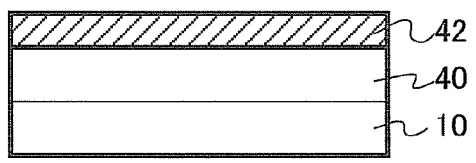
Figure 11C:
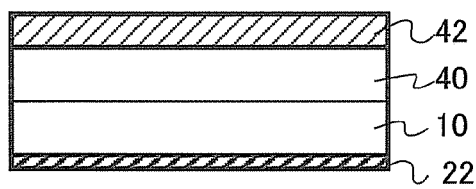
Figure 11D:
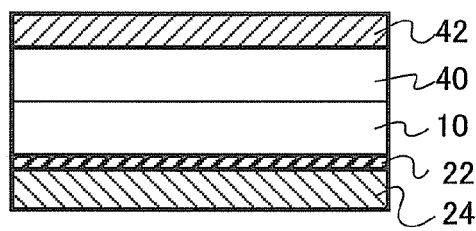
Figure 11E:
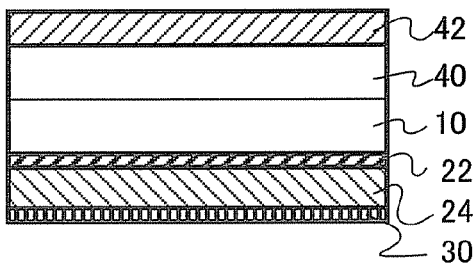

Then the second metal film 30 containing the second metal different from the first metal is deposited on the first metal film 24 (FIG. 11E).

Figure 11F:
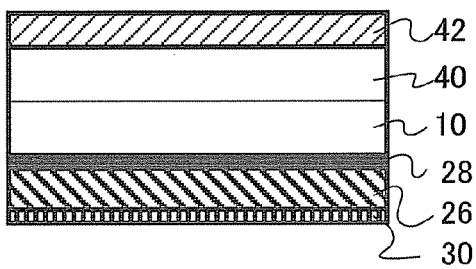

Then, for example, the heat treatment is performed by the RTA (Rapid Thermal Annealing). The silicon substrate 10 is caused to react with the first metal film 24 to form the silicide film 26 by the heat treatment. The interface layer 28 to which the sulfur atoms are introduced is also formed at the interface between the silicon substrate 10 and the silicide film 26 by the heat treatment (FIG. 11F).

The second metal film 30 acts as a cap film that prevents the oxidation of sulfur in the sulfur-containing film 22 during the heat treatment and/or the outward diffusion of sulfur.

According to the modification of the fourth embodiment, the contact resistance between the n-type semiconductor and the metal semiconductor compound can be reduced.

(Fifth Embodiment) A semiconductor device manufacturing method according to a fifth embodiment differs from that of the second embodiment in that the semiconductor device manufacturing method of the fifth embodiment is applied to not the formation of the drain electrode of the vertical power MOSFET, but the formation of the n-side electrode of the pn diode. Contents overlapping those of the second embodiment are partially omitted.

FIG. 12A to FIG. 12D are process sectional views illustrating the semiconductor device manufacturing method of the fifth embodiment.

For example, the n-type silicon (Si) substrate 10 in which phosphorus (P) is doped in the relatively low concentration is prepared. For example, preferably the n-type impurity concentration that is of the dopant is $3 \times 10^{18}$ cm$^{-3}$ or less in order to maintain the breakdown voltage.

Figure 12A:
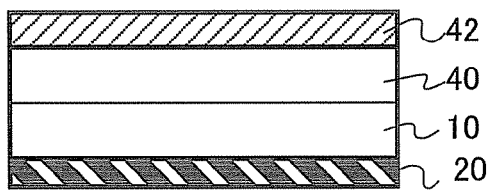
FIG. 12A to FIG. 12D are process sectional views illustrating a semiconductor device manufacturing method according to a fifth embodiment.

The p-type region 40 and the p-side electrode 42 are formed on the upper surface of the silicon substrate 10 by the well-known manufacturing method. The oxide film 20 such as the native oxide film or the protective oxide film is formed on the back side of the silicon substrate 10 (FIG. 12A).

Figure 12B:
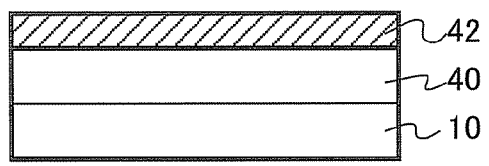

Then the oxide film 20 is removed by the etching (FIG. 12B).

Figure 12C:
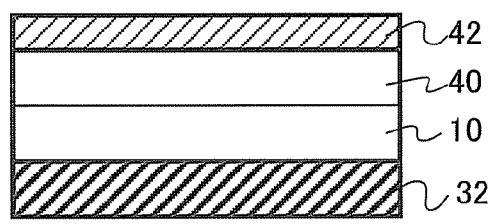

Then the sulfur-containing film 32 containing sulfur (S) and the first metal is deposited on the back side of the silicon substrate 10 (FIG. 12C).

Figure 12D:
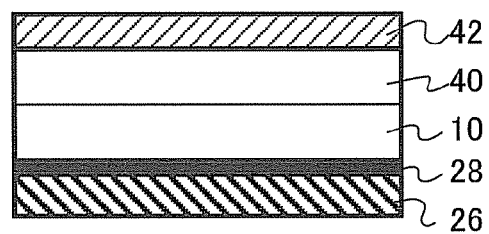

Then, for example, the heat treatment is performed by the RTA (Rapid Thermal Annealing). The silicon substrate 10 is caused to react with the sulfur-containing film 32 to form the silicide film 26 by the heat treatment. The interface layer 28 to which the sulfur atoms are introduced is also formed at the interface between the silicon substrate 10 and the silicide film 26 by the heat treatment (FIG. 12D).

The silicide film 26 acts as the n-side electrode of the diode.

According to the semiconductor device manufacturing method of the fifth embodiment, the effect similar to that of the second embodiment is obtained for the formation of the metal semiconductor compound electrode. Accordingly, the high-reliability, high-breakdown-voltage diode is realized through the inexpensive process.

FIG. 13 is a process sectional view illustrating a semiconductor device manufacturing method according to a modification of the fifth embodiment. The processes of the modification are similar to those of the fifth embodiment until the sulfur-containing film 32 is deposited (FIG. 13A to FIG. 13C).

Figure 13A:
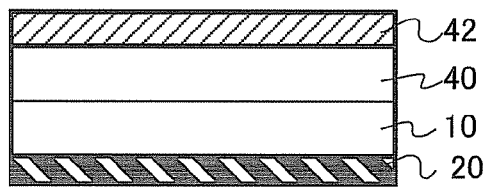
FIG. 13A to FIG. 13E are process sectional views illustrating a semiconductor device manufacturing method according to a modification of the fifth embodiment.
Figure 13E:
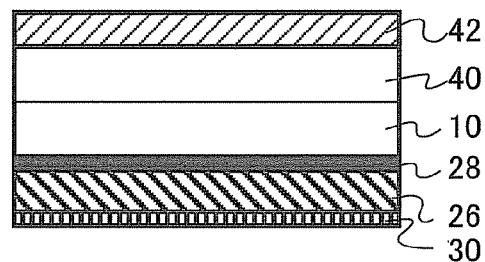
Figure 13B:
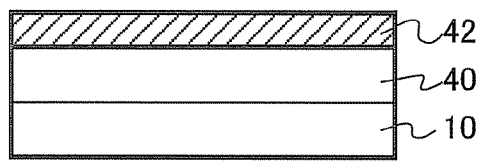
Figure 13C:
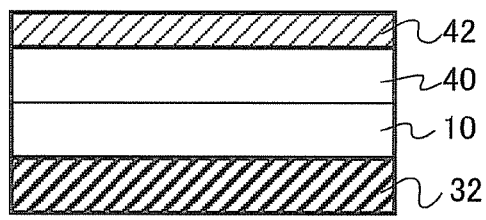
Figure 13D:
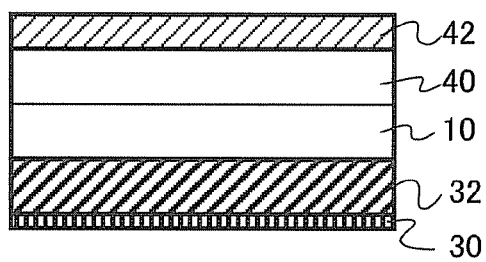

Then the second metal film 30 containing the second metal different from the first metal is deposited on the sulfur-containing film 32 (FIG. 13D). Then, for example, the heat treatment is performed by the RTA (Rapid Thermal Annealing). The silicon substrate 10 is caused to react with the sulfur-containing film 32 to form the silicide film 26 by the heat treatment. The interface layer 28 to which the sulfur atoms are introduced is also formed at the interface between the silicon substrate 10 and the silicide film 26 by the heat treatment (FIG. 13F).

The second metal film 30 acts as a cap film that prevents the oxidation of sulfur in the sulfur-containing film 22 during the heat treatment and/or the outward diffusion of sulfur.

According to the modification of the fifth embodiment, the contact resistance between the n-type semiconductor and the metal semiconductor compound can be reduced.

(Sixth Embodiment) A semiconductor device manufacturing method according to a sixth embodiment differs from that of the third embodiment in that the semiconductor device manufacturing method of the sixth embodiment is applied to not the formation of the drain electrode of the vertical power MOSFET, but the formation of the n-side electrode of the pn diode. Contents overlapping those of the third embodiment are partially omitted.

FIG. 14A to FIG. 14F are process sectional views illustrating the semiconductor device manufacturing method of the sixth embodiment.

For example, the n-type silicon (Si) substrate 10 in which phosphorus (P) is doped in the relatively low concentration is prepared. For example, preferably the n-type impurity concentration that is of the dopant is $3 \times 10^{18}$ cm$^{-3}$ or less in order to maintain the breakdown voltage of the diode.

Figure 14A:
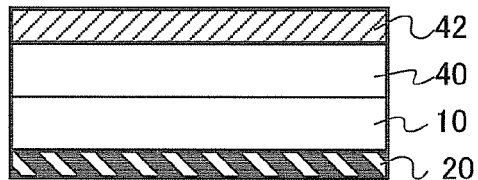
FIG. 14A to FIG. 14F are process sectional views illustrating a semiconductor device manufacturing method according to a sixth embodiment.

The p-type region 40 and the p-side electrode 42 are formed on the upper surface of the silicon substrate 10 by the well-known manufacturing method. The oxide film 20 such as the native oxide film or the protective oxide film is formed on the back side of the silicon substrate 10 (FIG. 14A).

Figure 14E:
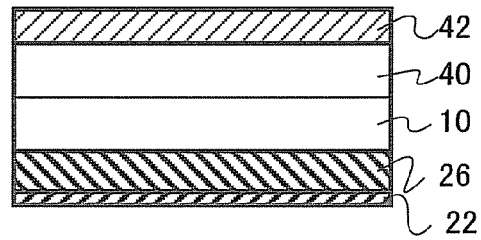
Figure 14B:
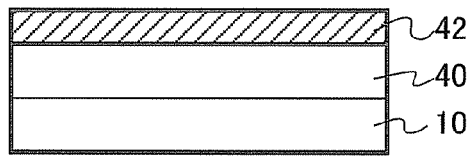

Then the oxide film 20 is removed by the etching (FIG. 14B).

Figure 14F:
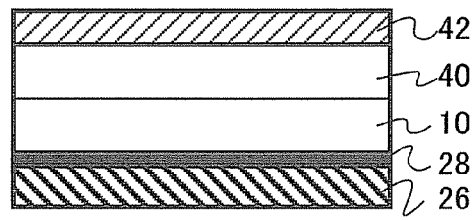
Figure 14C:
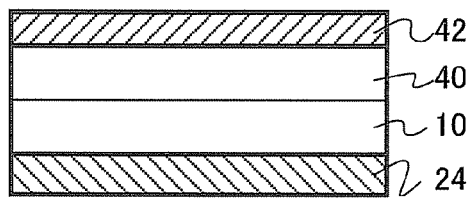

Then the first metal film 24 containing the first metal is deposited on the silicon substrate 10 (FIG. 14C).

Figure 14D:
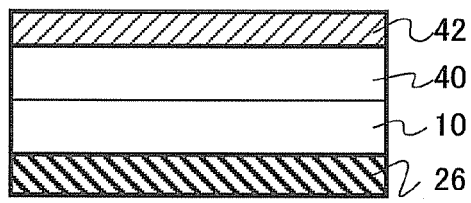

Then, for example, the first heat treatment is performed by the RTA (Rapid Thermal Annealing). The silicon substrate 10 is caused to react with the first metal film 24 to form the silicide film 26 by the first heat treatment (FIG. 14D).

Then the sulfur-containing film 22 containing sulfur (S) is deposited on the silicide film 26 (FIG. 14E).

Then, for example, the second heat treatment is performed by the RTA (Rapid Thermal Annealing). The interface layer 28 to which the sulfur atoms are introduced is formed at the interface between the silicon substrate 10 and the silicide film 26 by the second heat treatment (FIG. 14F).

The silicide film 26 acts as the n-side electrode of the diode.

According to the semiconductor device manufacturing method of the sixth embodiment, the effect similar to that of the third embodiment is obtained for the formation of the metal semiconductor compound electrode. Accordingly, the high-reliability, high-breakdown-voltage diode is realized through the inexpensive process.

FIG. 15A to FIG. 15G are process sectional views illustrating a semiconductor device manufacturing method according to a modification of the sixth embodiment. The processes of the modification are similar to those of the sixth embodiment until the sulfur-containing film 22 is deposited on the first metal film 24 (FIG. 15A to FIG. 15E).

Figure 15A:
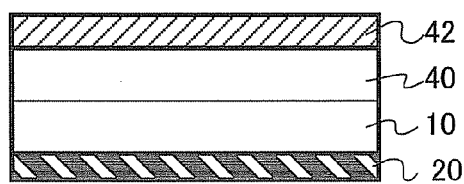
FIG. 15A to FIG. 15G are process sectional views illustrating a semiconductor device manufacturing method according to a modification of the sixth embodiment.
Figure 15B:
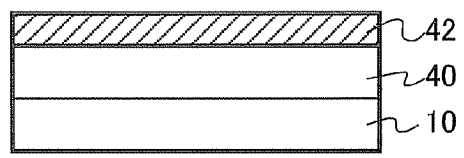
Figure 15C:
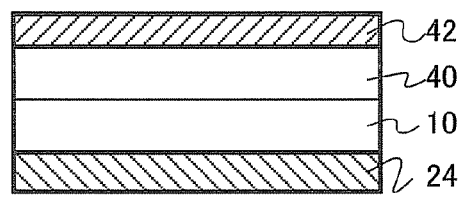
Figure 15D:
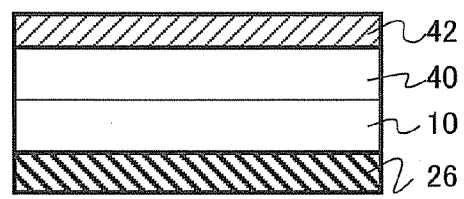
Figure 15E:
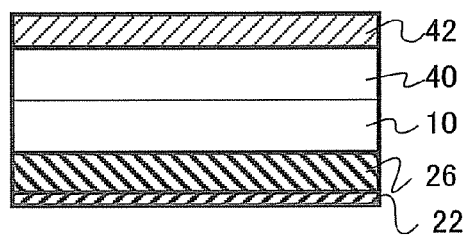
Figure 15F:
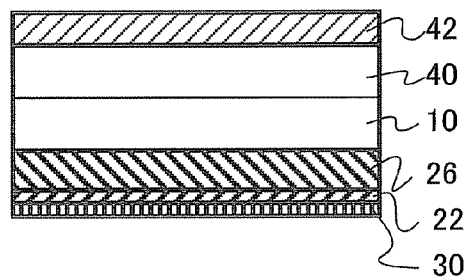
Figure 15G:
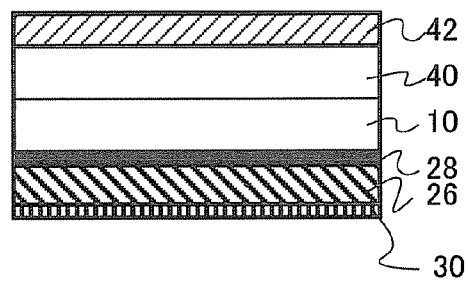

Then the second metal film 30 containing the second metal different from the first metal is deposited on the sulfur-containing film 22 (FIG. 15F). Then, for example, the second heat treatment is performed by the RTA (Rapid Thermal Annealing). The interface layer 28 to which the sulfur atoms are introduced is formed at the interface between the silicon substrate 10 and the silicide film 26 by the second heat treatment (FIG. 15G).

The second metal film 30 acts as a cap film that prevents the oxidation of sulfur in the sulfur-containing film 22 during the heat treatment and/or the outward diffusion of sulfur.

According to the modification of the sixth embodiment, the contact resistance between the n-type semiconductor and the metal semiconductor compound can be reduced.

(Seventh Embodiment) A semiconductor device manufacturing method according to a seventh embodiment differs from that of the first embodiment in that the semiconductor device manufacturing method of the seventh embodiment is applied to not the formation of the drain electrode of the vertical power MOSFET, but the formation of a source-drain electrode of an n-type MOSFET for logic. Contents overlapping those of the first embodiment are partially omitted.

FIG. 16A to FIG. 16F are process sectional views illustrating the semiconductor device manufacturing method of the seventh embodiment.

For example, a p-type silicon (Si) substrate 10 is prepared.

Figure 16A:
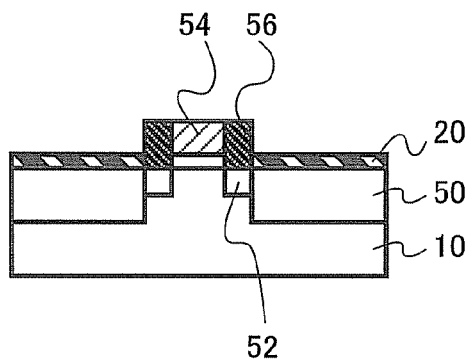
FIG. 16A to FIG. 16F are process sectional views illustrating a semiconductor device manufacturing method according to a seventh embodiment.

An n+-type source-drain region 50, an n--type extension region 52, a gate electrode 54, and a gate sidewall 56 are formed on the upper surface of the silicon substrate 10 by the well-known manufacturing method. The oxide film 20 such as the native oxide film is formed on the n+-type source-drain region 50 (FIG. 16A).

Figure 16B:
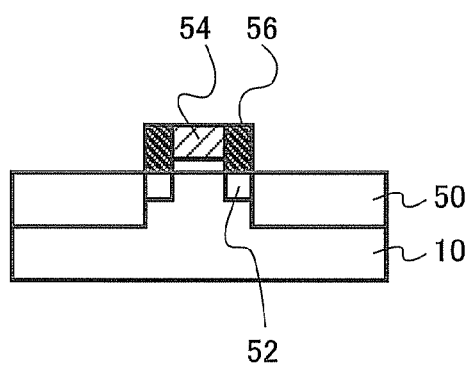

Then the oxide film 20 is removed by etching (FIG. 16B).

Figure 16C:
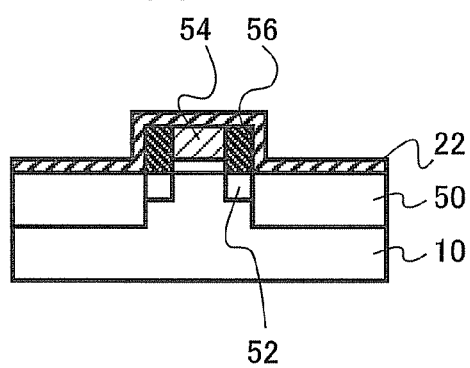

Then the sulfur-containing film 22 containing sulfur (S) is deposited on the n+-type source-drain region 50 (FIG. 16C).

Figure 16D:
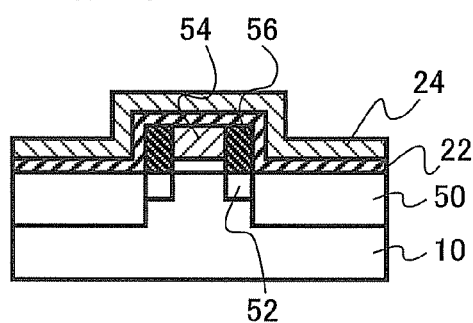

Then the first metal film 24 containing the first metal is deposited on the sulfur-containing film 22 (FIG. 16D).

Figure 16E:
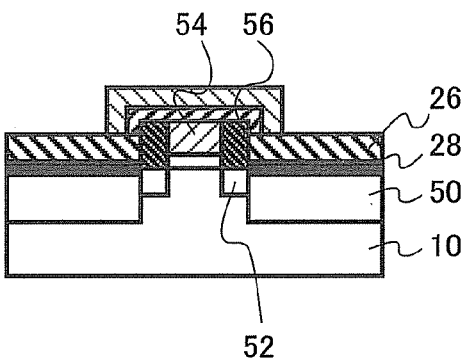

Then, for example, the heat treatment is performed by the RTA (Rapid Thermal Annealing). The silicon substrate 10 is caused to react with the first metal film 24 to form the silicide film 26 by the heat treatment. The interface layer 28 to which the sulfur atoms are introduced is also formed at the interface between the silicon substrate 10 and the silicide film 26 by the heat treatment (FIG. 16E).

Figure 16F:
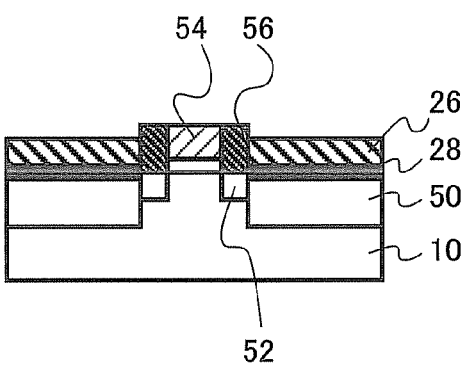

Then the unreacted sulfur-containing film 22 and the unreacted first metal film 24 are removed by wet etching using an acid (FIG. 16F).

The silicide film 26 acts as the source-drain electrode of the n-type MOSFET.

According to the semiconductor device manufacturing method of the seventh embodiment, the effect similar to that of the first embodiment is obtained for the formation of the metal semiconductor compound electrode. Accordingly, the high-reliability MOSFET having high driving power is realized through the inexpensive process.

Particularly, the realization of the high reliability is expected because of no risk of the device characteristic degradation, such as the reliability degradation of the gate insulator and an increase in leakage current of the MOSFET, which may be caused by the damage of the ion implantation.

FIG. 17A to FIG. 17G are process sectional views illustrating a semiconductor device manufacturing method according to a modification of the seventh embodiment. The processes of the modification are similar to those of the seventh embodiment until the first metal film 24 containing the first metal is deposited on the sulfur-containing film 22 (FIG. 17A to FIG. 17D).

Figure 17A:
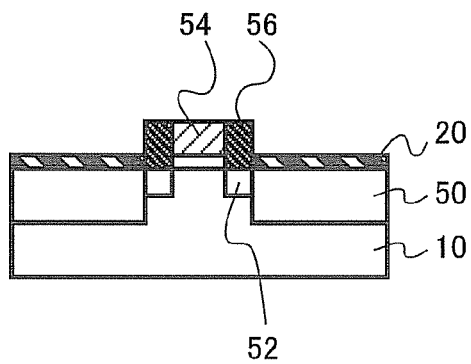
FIG. 17A to FIG. 17G are process sectional views illustrating a semiconductor device manufacturing method according to a modification of the seventh embodiment.
Figure 17B:
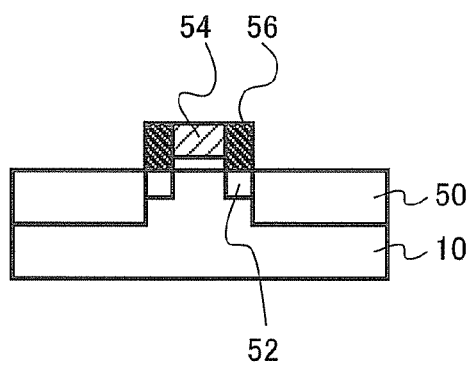
Figure 17C:
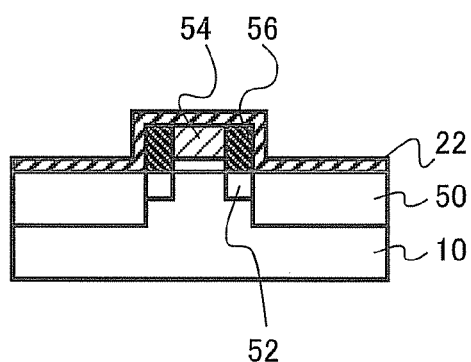
Figure 17D:
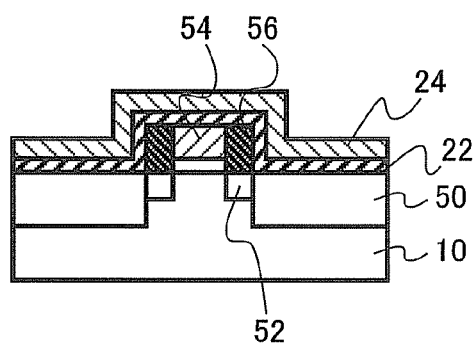
Figure 17E:
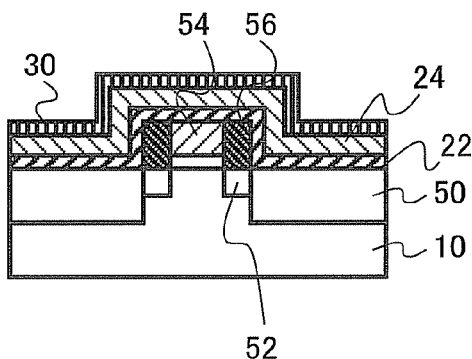

Then the second metal film 30 containing the second metal different from the first metal is deposited on the first metal film 24 (FIG. 17E).

Figure 17F:
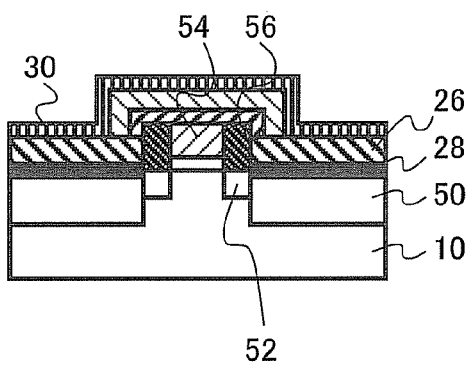

Then, for example, the heat treatment is performed by the RTA (Rapid Thermal Annealing). The silicon substrate 10 is caused to react with the first metal film 24 to form a silicide film 26 by the heat treatment. The interface layer 28 to which the sulfur atoms are introduced is also formed at the interface between the silicon substrate 10 and the silicide film 26 by the heat treatment (FIG. 17F).

The second metal film 30 acts as a cap film that prevents the oxidation of sulfur in the sulfur-containing film 22 during the heat treatment and/or the outward diffusion of sulfur.

Figure 17G:
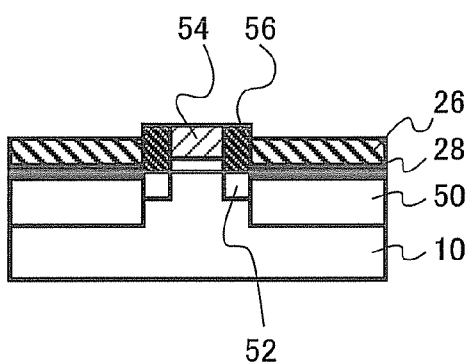

Then the second metal film 30, the unreacted sulfur-containing film 22, and the unreacted first metal film 24 are removed by the wet etching using the acid (FIG. 17G)

According to the modification of the seventh embodiment, the contact resistance between the n-type semiconductor and the metal semiconductor compound can be reduced.

The so-called gate-first process of forming the gate electrode prior to the formation of the source-drain structure is performed in the seventh embodiment by way of example. Alternatively, a so-called gate-last process of forming the gate electrode after the formation of the source-drain structure may be adopted.

(Eighth Embodiment) A semiconductor device manufacturing method according to an eighth embodiment differs from that of the second embodiment in that the semiconductor device manufacturing method of the eighth embodiment is applied to not the formation of the drain electrode of the vertical power MOSFET, but the formation of the source-drain electrode of the n-type MOSFET for logic. Contents overlapping those of the second embodiment are partially omitted.

FIG. 18A to FIG. 18E are process sectional views illustrating the semiconductor device manufacturing method of the eighth embodiment.

For example, the p-type silicon (Si) substrate 10 is prepared.

Figure 18A:
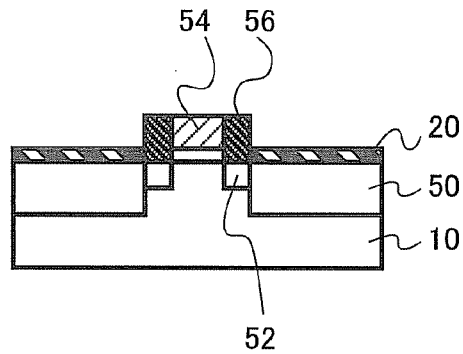
FIG. 18A to FIG. 18E are process sectional views illustrating a semiconductor device manufacturing method according to an eighth embodiment.

The n+-type source-drain region 50, the n--type extension region 52, the gate electrode 54, and the gate sidewall 56 are formed on the upper surface of the silicon substrate 10 by the well-known manufacturing method. The oxide film 20 such as the native oxide film is formed on the n+-type source-drain region 50 (FIG. 18A).

Figure 18E:
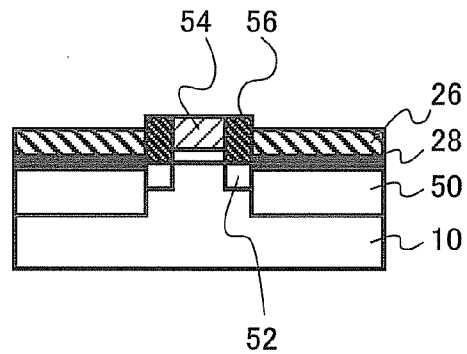
Figure 18B:
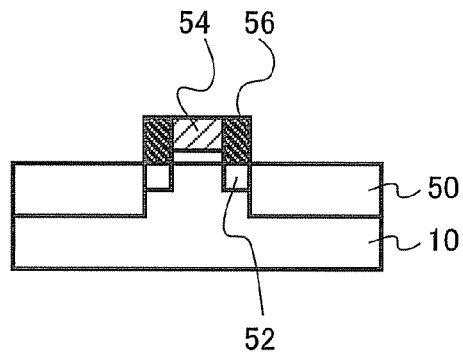

Then the oxide film 20 is removed by etching (FIG. 18B).

Figure 18C:
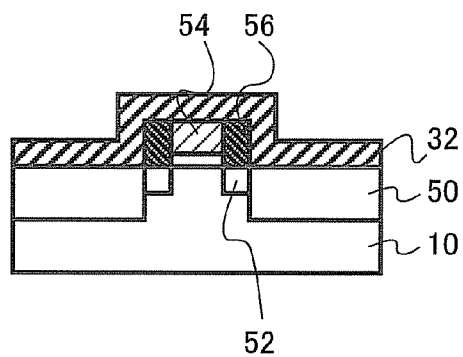

Then the sulfur-containing film 32 containing sulfur (S) and the first metal is deposited on the n+-type source-drain region 50 (FIG. 18C).

Figure 18D:
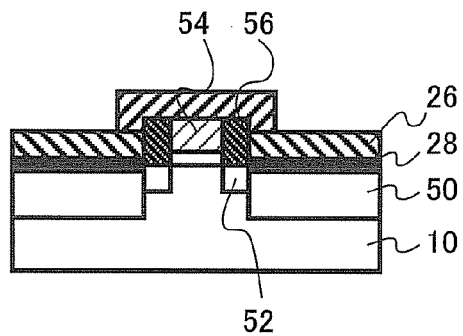

Then, for example, the heat treatment is performed by the RTA (Rapid Thermal Annealing). The silicon substrate 10 is caused to react with the sulfur-containing film 32 to form the silicide film 26 by the heat treatment. The interface layer 28 to which the sulfur atoms are introduced is also formed at the interface between the silicon substrate 10 and the silicide film 26 by the heat treatment (FIG. 18D).

Then the unreacted sulfur-containing film 32 is removed by the wet etching using the acid (FIG. 18E).

According to the semiconductor device manufacturing method of the eighth embodiment, the effect similar to that of the second embodiment is obtained for the formation of the metal semiconductor compound electrode. Accordingly, the high-reliability MOSFET having the high driving power is realized through the inexpensive process.

Particularly, the realization of the high reliability is expected because of no risk of the device characteristic degradation, such as the reliability degradation of the gate insulator and the increase in leakage current of the MOSFET, which may be caused by the damage of the ion implantation.

Figure 19A:
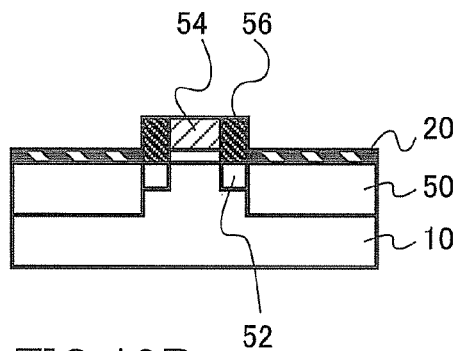
FIG. 19A to FIG. 19F are process sectional views illustrating a semiconductor device manufacturing method according to a modification of the eighth embodiment.
Figure 19B:
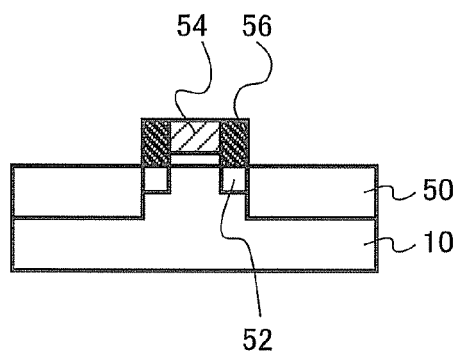
Figure 19C:
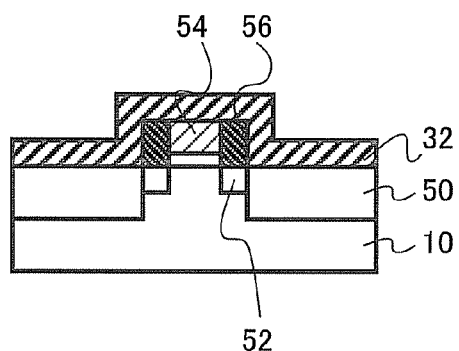

FIG. 19A to FIG. 19F are process sectional views illustrating a semiconductor device manufacturing method according to a modification of the eighth embodiment. The processes of the modification are similar to those of the eighth embodiment until the sulfur-containing film 32 is deposited (FIG. 19A to FIG. 19C).

Figure 19D:
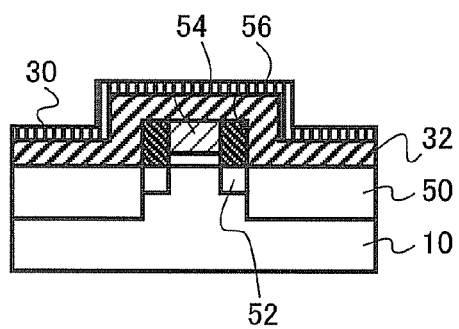
Figure 19E:
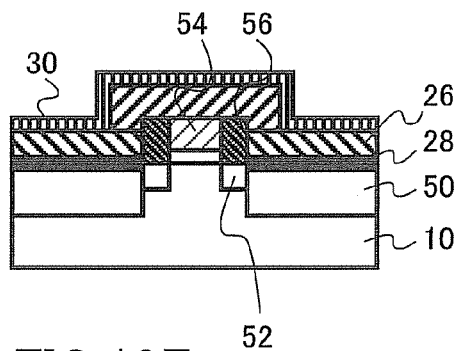

Then the second metal film 30 containing the second metal different from the first metal is deposited on the sulfur-containing film 32 (FIG. 19D). Then, for example, the heat treatment is performed by the RTA (Rapid Thermal Annealing). The silicon substrate 10 is caused to react with the sulfur-containing film 32 to form the silicide film 26 by the heat treatment. An interface layer 28 to which sulfur atoms are introduced is also formed at the interface between the silicon substrate 10 and the silicide film 26 by the heat treatment (FIG. 19E).

The second metal film 30 acts as a cap film that prevents the oxidation of sulfur in the sulfur-containing film 22 during the heat treatment and/or the outward diffusion of sulfur.

Figure 19F:
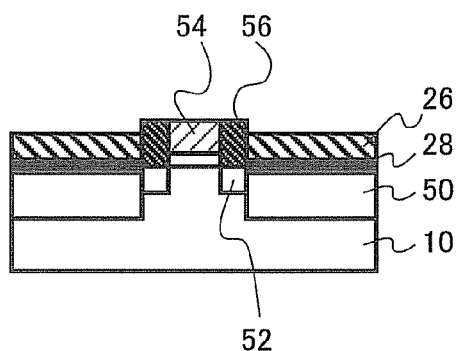

Then the second metal film 30 and the unreacted sulfur-containing film 32 are removed by the wet etching using the acid (FIG. 19F).

According to the modification of the eighth embodiment, the contact resistance between the n-type semiconductor and the metal semiconductor compound can be reduced.

(Ninth Embodiment) A semiconductor device manufacturing method according to a ninth embodiment differs from that of the third embodiment in that the semiconductor device manufacturing method of the ninth embodiment is applied to not the formation of the drain electrode of the vertical power MOSFET, but the formation of the source-drain electrode of the n-type MOSFET for logic. Contents overlapping those of the third embodiment are partially omitted.

FIG. 20A to FIG. 20G are process sectional views illustrating the semiconductor device manufacturing method of the ninth embodiment.

For example, the p-type silicon (Si) substrate 10 is prepared.

Figure 20A:
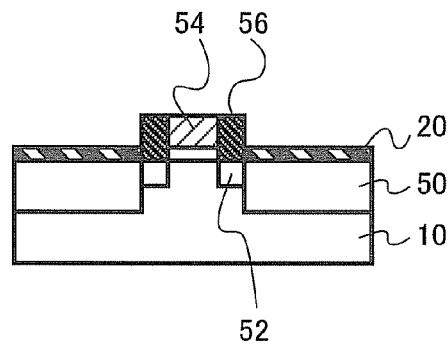
FIG. 20A to FIG. 20G are process sectional views illustrating a semiconductor device manufacturing method according to a ninth embodiment.

The n+-type source-drain region 50, the n−-type extension region 52, the gate electrode 54, and the gate sidewall 56 are formed on the upper surface of the silicon substrate 10 by the well-known manufacturing method. The oxide film 20 such as the native oxide film is formed on the n+-type source-drain region 50 (FIG. 20A).

Figure 20E:
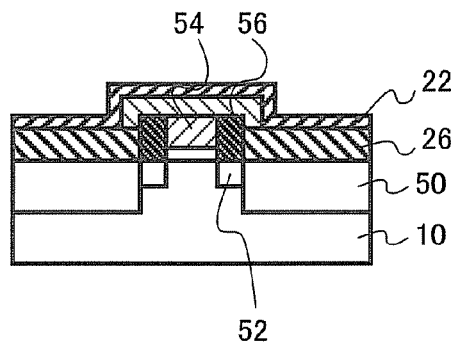
Figure 20B:
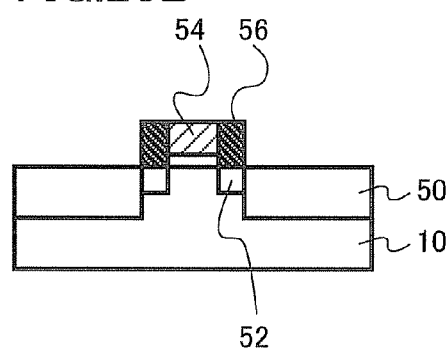
Figure 20F:
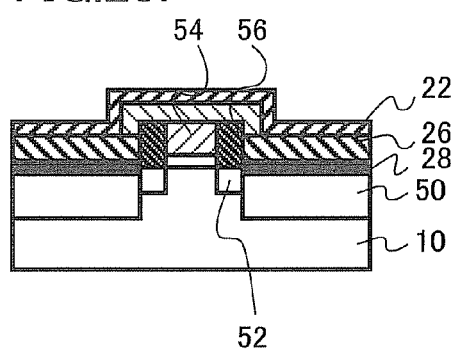
Figure 20C:
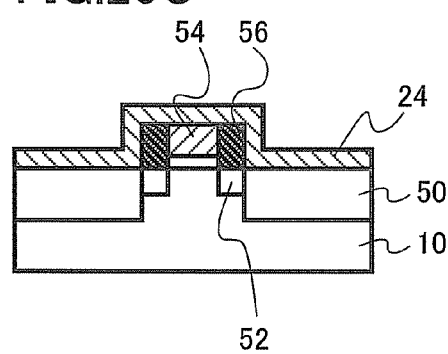

Then the oxide film 20 is removed by etching (FIG. 20B).
Then the first metal film 24 containing the first metal is deposited on the n+-type source-drain region 50 (FIG. 20C).

Then, for example, the first heat treatment is performed by the RTA (Rapid Thermal Annealing). The silicon substrate 10 is caused to react with the first metal film 24 to form the silicide film 26 by the first heat treatment (FIG. 20D).

Then the sulfur-containing film 22 containing sulfur (S) is deposited on the silicide film 26 (FIG. 20E).

Then, for example, the second heat treatment is performed by the RTA (Rapid Thermal Annealing). The interface layer 28 to which the sulfur atoms are introduced is formed at the interface between the silicon substrate 10 and the silicide film 26 by the second heat treatment (FIG. 20F).

Figure 20G:
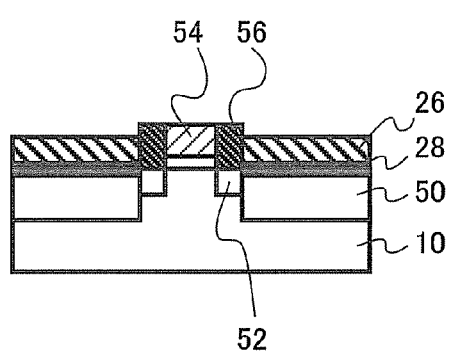
Figure 20D:
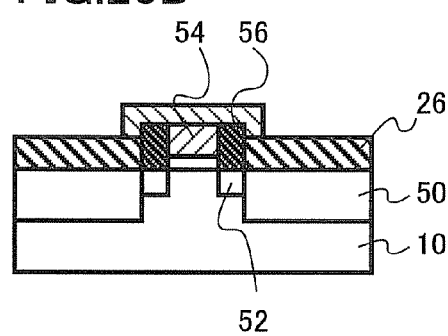

Then the unreacted sulfur-containing film 22 and the unreacted first metal film 24 are removed by the wet etching using the acid (FIG. 20G).

The silicide film 26 acts as the source-drain electrode of the n-type MOSFET.

According to the semiconductor device manufacturing method of the ninth embodiment, the effect similar to that of the third embodiment is obtained for the formation of the metal semiconductor compound electrode. Accordingly, the high-reliability MOSFET having the high driving power is realized through the inexpensive process.

Particularly, the realization of the high reliability is expected because of no risk of the device characteristic degradation, such as the reliability degradation of the gate insulator and the increase in leakage current of the MOSFET, which may be caused by the damage of the ion implantation.

FIG. 21A to FIG. 21H are process sectional views illustrating a semiconductor device manufacturing method according to a modification of the ninth embodiment. The processes of the modification are similar to those of the ninth embodiment until the sulfur-containing film 22 is deposited on the first metal film 24 (FIG. 21A to FIG. 21E).

Figure 21A:
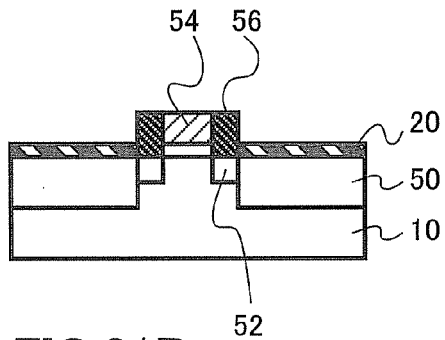
FIG. 21A to FIG. 21H are process sectional views illustrating a semiconductor device manufacturing method according to a modification of the ninth embodiment.
Figure 21E:
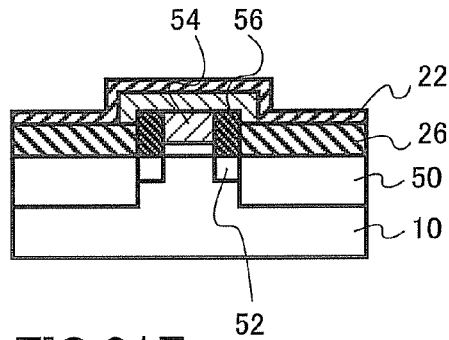
Figure 21B:
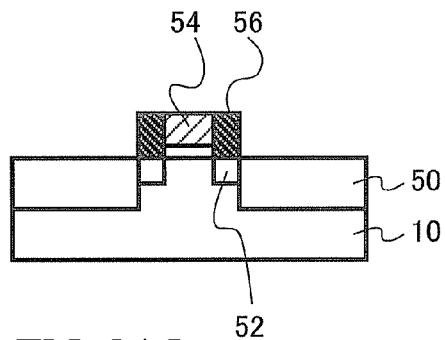
Figure 21F:
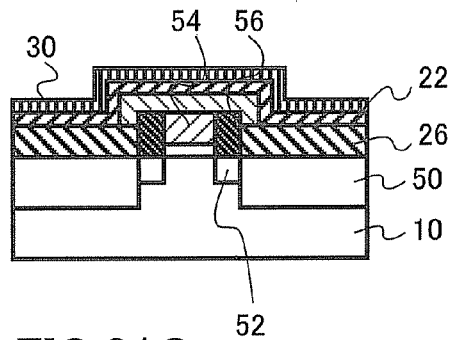
Figure 21C:
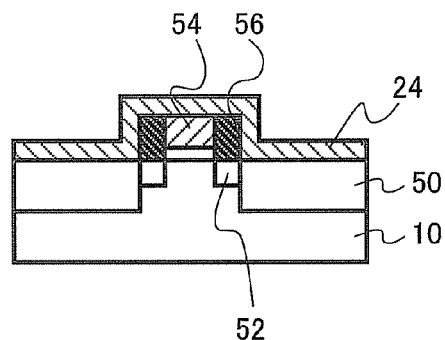
Figure 21G:
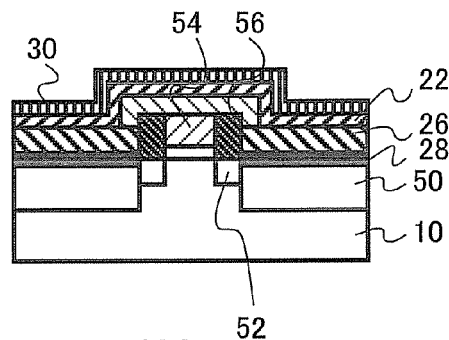
Figure 21D:
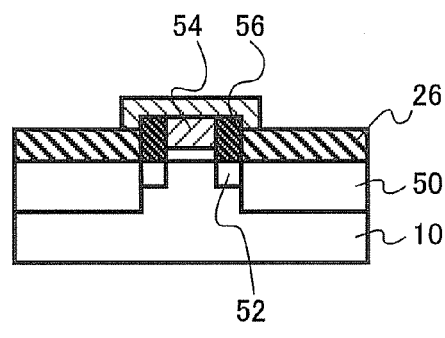

Then the second metal film 30 containing the second metal different from the first metal is deposited on the sulfur-containing film 22 (FIG. 21F). Then, for example, the second heat treatment is performed by the RTA (Rapid Thermal Annealing). The interface layer 28 to which the sulfur atoms are introduced is formed at the interface between the silicon substrate 10 and the silicide film 26 by the second heat treatment (FIG. 21G).

The second metal film 30 acts as a cap film that prevents the oxidation of sulfur in the sulfur-containing film 22 during the heat treatment and/or the outward diffusion of sulfur.

Figure 21H:
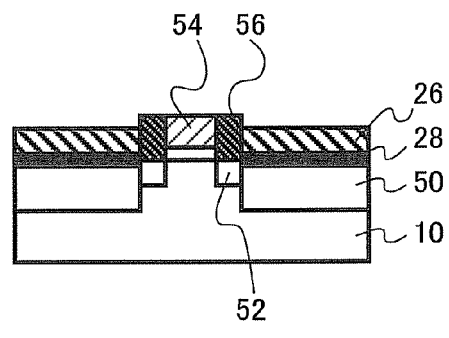

Then the second metal film 30, the unreacted sulfur-containing film 22, and the unreacted first metal film 24 are removed by the wet etching using the acid (FIG. 21H).

According to the modification of the ninth embodiment, the contact resistance between the n-type semiconductor and the metal semiconductor compound can be reduced.

(Tenth Embodiment) A semiconductor device manufacturing method according to a tenth embodiment differs from that of the first embodiment in that the semiconductor device manufacturing method of the tenth embodiment is applied to not the formation of the drain electrode of the vertical power MOSFET, but the formation of an contact electrode formed between a substrate and an interconnection layer. Contents overlapping those of the first embodiment are partially omitted.

FIG. 22A to FIG. 22E are process sectional views illustrating the semiconductor device manufacturing method of the tenth embodiment.

For example, the p-type silicon (Si) substrate 10 is prepared.

Figure 22A:
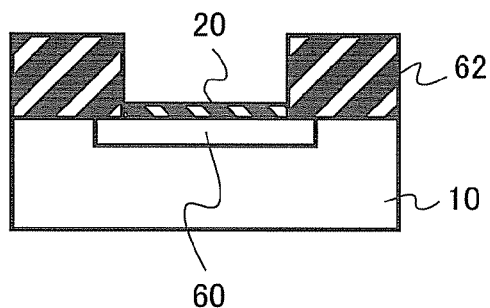
FIG. 22A to FIG. 22E are process sectional views illustrating a semiconductor device manufacturing method according to a tenth embodiment.

An n-type region 60, an interlayer insulator 62, and a contact hole in which the interlayer insulator 62 is opened in the n-type region 60 are formed on the upper surface of the silicon substrate 10 by the well-known manufacturing method. The oxide film 20 such as the native oxide film is formed in a bottom portion of the contact hole of the silicon substrate 10 (FIG. 22A).

Figure 22E:
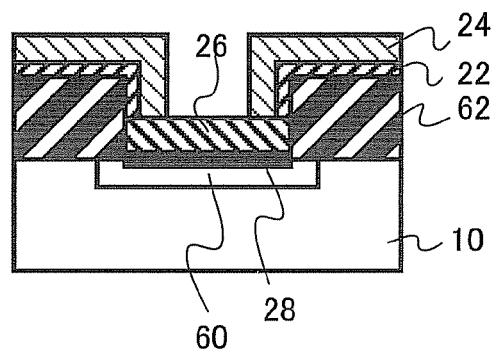
Figure 22B:
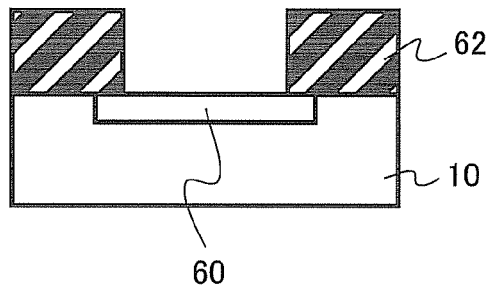

Then the oxide film 20 is removed by the etching (FIG. 22B).

Figure 22C:
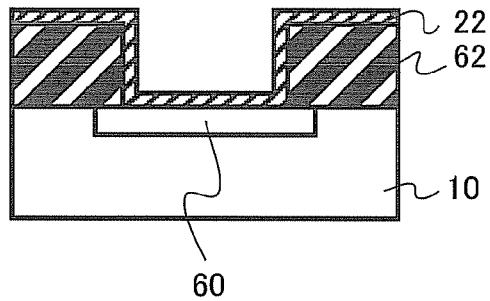

Then the sulfur-containing film 22 containing sulfur (S) is deposited (FIG. 22C).

Figure 22D:
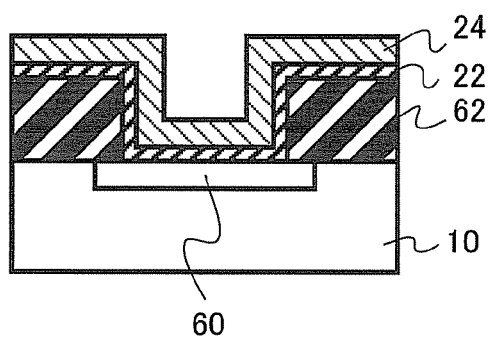

Then the first metal film 24 containing the first metal is deposited on the sulfur-containing film 22 (FIG. 22D).

Then, for example, the heat treatment is performed by the RTA (Rapid Thermal Annealing). The silicon substrate 10 is caused to react with the first metal film 24 to form the silicide film 26 by the heat treatment. The interface layer 28 to which the sulfur atoms are introduced is also formed at the interface between the silicon substrate 10 and the silicide film 26 by the heat treatment (FIG. 22E).

The silicide film 26 acts as the contact electrode.

According to the semiconductor device manufacturing method of the tenth embodiment, the effect similar to that of the first embodiment is obtained for the formation of the metal semiconductor compound electrode. Accordingly, the low-resistance contact electrode is realized through the inexpensive process.

FIG. 23A to FIG. 23F are process sectional views illustrating a semiconductor device manufacturing method according to a modification of the tenth embodiment. The processes of the modification are similar to those of the tenth embodiment until the first metal film 24 containing the first metal is deposited on the sulfur-containing film 22 (FIG. 23A to FIG. 23D).

Figure 23A:
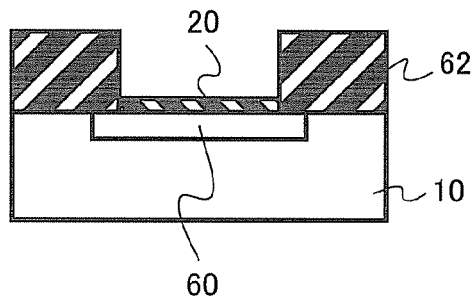
FIG. 23A to FIG. 23F are process sectional views illustrating a semiconductor device manufacturing method according to a modification of the tenth embodiment.
Figure 23B:
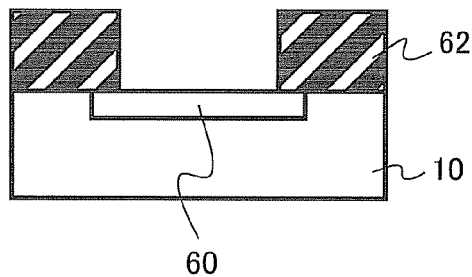
Figure 23C:
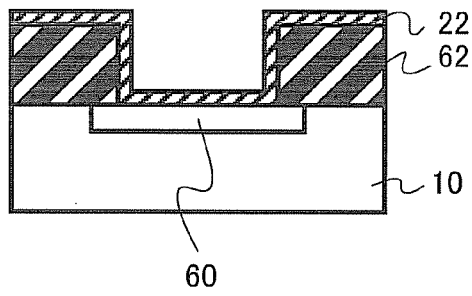
Figure 23D:
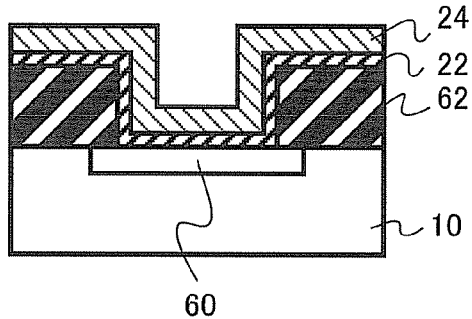
Figure 23E:
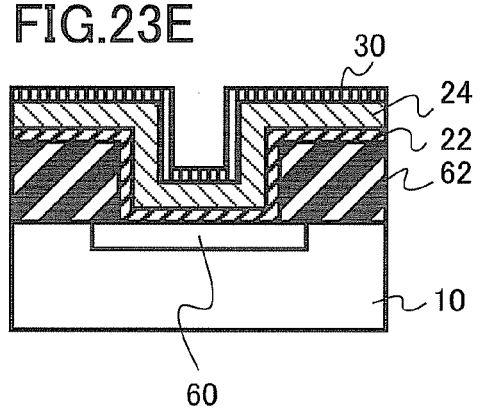

Then the second metal film 30 containing the second metal different from the first metal is deposited on the first metal film 24 (FIG. 23E).

Figure 23F:
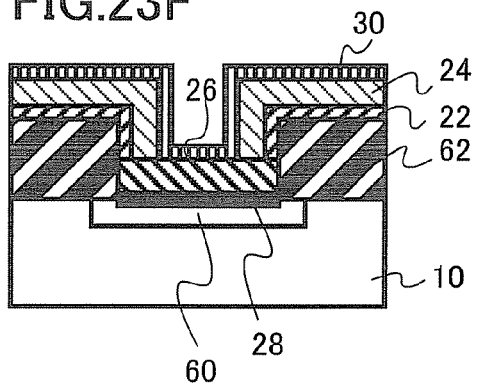

Then, for example, the heat treatment is performed by the RTA (Rapid Thermal Annealing). The silicon substrate 10 is caused to react with the first metal film 24 to form the silicide film 26 by the heat treatment. The interface layer 28 to which the sulfur atoms are introduced is also formed at the interface between the silicon substrate 10 and the silicide film 26 by the heat treatment (FIG. 23F).

The second metal film 30 acts as a cap film that prevents the oxidation of sulfur in the sulfur-containing film 22 during the heat treatment or the outward diffusion of sulfur.

According to the modification of the tenth embodiment, the contact resistance between the n-type semiconductor and the metal semiconductor compound can be reduced.

(Eleventh Embodiment) A semiconductor device manufacturing method according to an eleventh embodiment differs from that of the second embodiment in that the semiconductor device manufacturing method of the eleventh embodiment is applied to not the formation of the drain electrode of the vertical power MOSFET, but the formation of the contact electrode formed between a substrate and an interconnection layer. Contents overlapping those of the second embodiment are partially omitted.

FIG. 24A to FIG. 24D are process sectional views illustrating the semiconductor device manufacturing method of the eleventh embodiment.

For example, the p-type silicon (Si) substrate 10 is prepared.

Figure 24A:
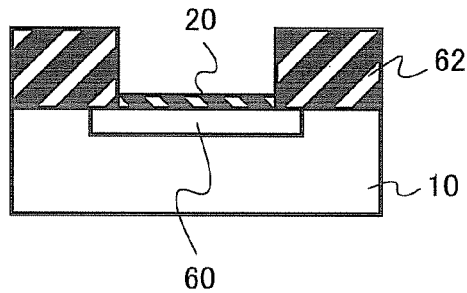
FIG. 24A to FIG. 24D are process sectional views illustrating a semiconductor device manufacturing method according to an eleventh embodiment.

The n-type region 60, the interlayer insulator 62, and the contact hole in which the interlayer insulator 62 is opened in the n-type region 60 are formed on the upper surface of the silicon substrate 10 by the well-known manufacturing method. The oxide film 20 such as the native oxide film is formed in the bottom portion of the contact hole of the silicon substrate 10 (FIG. 24A).

Figure 24B:
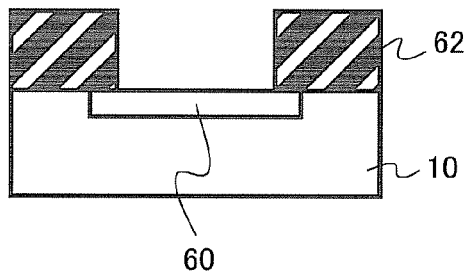

Then the oxide film 20 is removed by the etching (FIG. 24B).

Figure 24C:
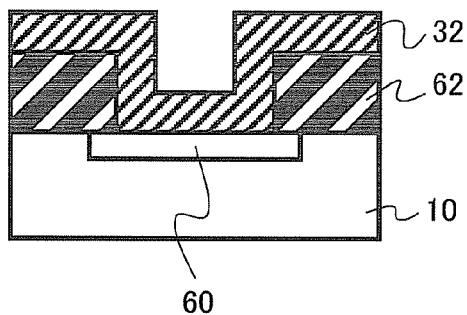

Then the sulfur-containing film 32 containing sulfur (S) and the first metal is deposited (FIG. 24C).

Figure 24D:
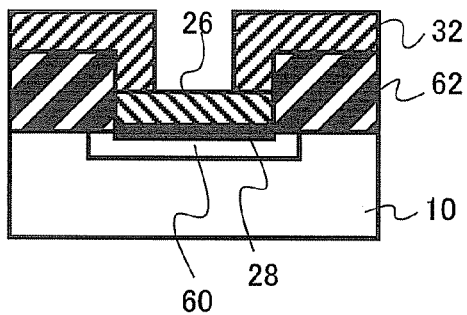

Then, for example, the heat treatment is performed by the RTA (Rapid Thermal Annealing). The silicon substrate 10 is caused to react with the sulfur-containing film 32 to form the silicide film 26 by the heat treatment. The interface layer 28 to which the sulfur atoms are introduced is also formed at the interface between the silicon substrate 10 and the silicide film 26 by the heat treatment (FIG. 24D).

The silicide film 26 acts as the contact electrode.

According to the semiconductor device manufacturing method of the eleventh embodiment, the effect similar to that of the second embodiment is obtained for the formation of the metal semiconductor compound electrode. Accordingly, the low-resistance contact electrode is realized through the inexpensive process.

Figure 25A:
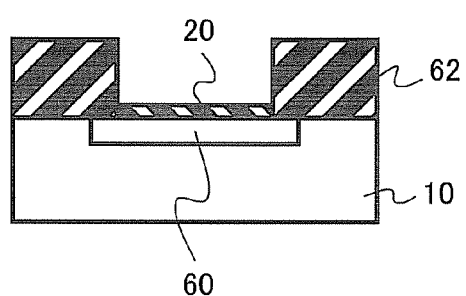
FIG. 25A to FIG. 25E are process sectional views illustrating a semiconductor device manufacturing method according to a modification of the eleventh embodiment.
Figure 25B:
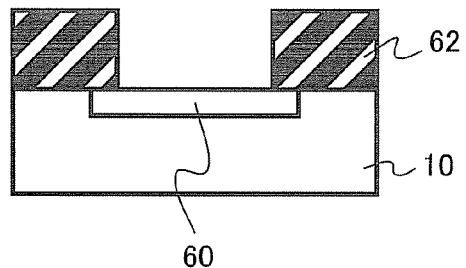
Figure 25C:
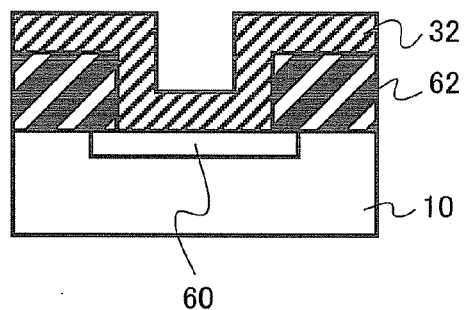

FIG. 25A to FIG. 25E are process sectional views illustrating a semiconductor device manufacturing method according to a modification of the eleventh embodiment. The processes of the modification are similar to those of the eleventh embodiment until the sulfur-containing film 32 is deposited (FIG. 25A to FIG. 25C).

Figure 25D:
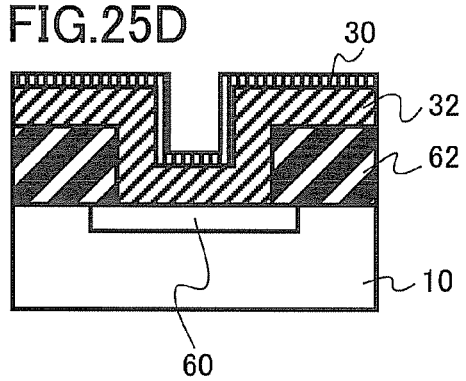
Figure 25E:
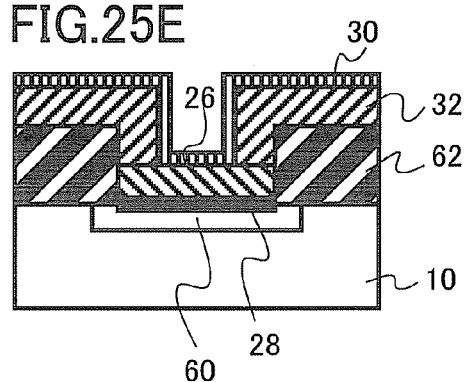

Then the second metal film 30 containing the second metal different from the first metal is deposited on the sulfur-containing film 32 (FIG. 25D). Then, for example, the heat treatment is performed by the RTA (Rapid Thermal Annealing). The silicon substrate 10 is caused to react with the sulfur-containing film 32 to form the silicide film 26 by the heat treatment. The interface layer 28 to which the sulfur atoms are introduced is also formed at the interface between the silicon substrate 10 and the silicide film 26 by the heat treatment (FIG. 25E).

The second metal film 30 acts as a cap film that prevents the oxidation of sulfur in the sulfur-containing film 22 during the heat treatment or the outward diffusion of sulfur.

According to the modification of the eleventh embodiment, the contact resistance between the n-type semiconductor and the metal semiconductor compound can be reduced.

(Twelfth Embodiment) A semiconductor device manufacturing method according to a twelfth embodiment differs from that of the third embodiment in that the semiconductor device manufacturing method of the twelfth embodiment is applied to not the formation of the drain electrode of the vertical power MOSFET, but the formation of the contact electrode formed between a substrate and an interconnection layer. Contents overlapping those of the third embodiment are partially omitted.

FIG. 26A to FIG. 26F are process sectional views illustrating the semiconductor device manufacturing method of the twelfth embodiment.

For example, the p-type silicon (Si) substrate 10 is prepared.

Figure 26A:
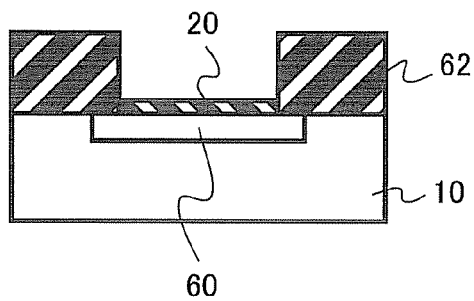
FIG. 26A to FIG. 26F are process sectional views illustrating a semiconductor device manufacturing method according to a twelfth embodiment.

The n-type region 60, the interlayer insulator 62, and the contact hole in which the interlayer insulator 62 is opened in the n-type region 60 are formed on the upper surface of the silicon substrate 10 by the well-known manufacturing method. The oxide film 20 such as the native oxide film is formed in the bottom portion of the contact hole of the silicon substrate 10 (FIG. 26A).

Figure 26B:
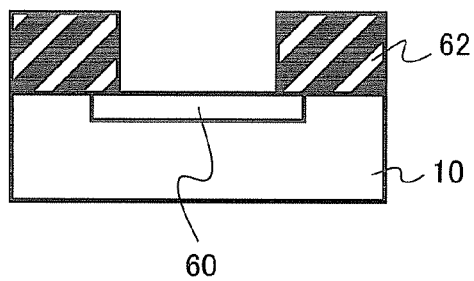

Then the oxide film 20 is removed by the etching (FIG. 26B).

Figure 26C:
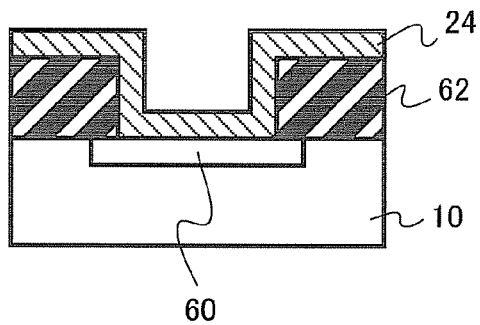

Then the first metal film 24 containing the first metal is deposited (FIG. 26C).

Figure 26D:
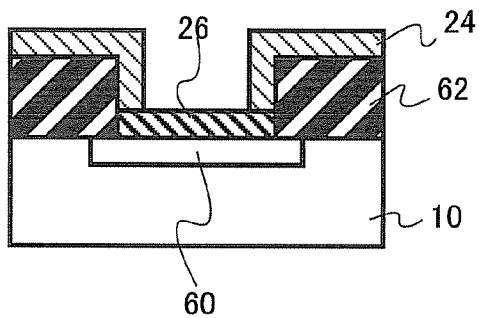

Then, for example, the first heat treatment is performed by the RTA (Rapid Thermal Annealing). The silicon substrate 10 is caused to react with the first metal film 24 to form the silicide film 26 by the first heat treatment (FIG. 26D).

Figure 26E:
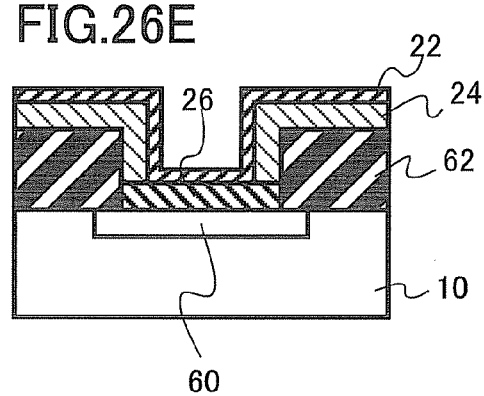

Then the sulfur-containing film 22 containing sulfur (S) is deposited on the silicide film 26 (FIG. 26E).

Figure 26F:
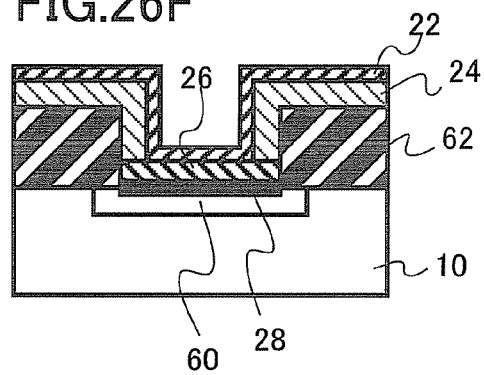

Then, for example, the second heat treatment is performed by the RTA (Rapid Thermal Annealing). The interface layer 28 to which the sulfur atoms are introduced is formed at the interface between the silicon substrate 10 and the silicide film 26 by the second heat treatment (FIG. 26F).

The silicide film 26 acts as the contact electrode.

According to the semiconductor device manufacturing method of the twelfth embodiment, the effect similar to that of the third embodiment is obtained for the formation of the metal semiconductor compound electrode. Accordingly, the low-resistance contact electrode is realized through the inexpensive process.

FIG. 27A to FIG. 27G are process sectional views illustrating a semiconductor device manufacturing method according to a modification of the twelfth embodiment. The processes of the modification are similar to those of the twelfth embodiment until the sulfur-containing film 22 is deposited on the first metal film 24 (FIG. 27A to FIG. 27E).

Figure 27A:
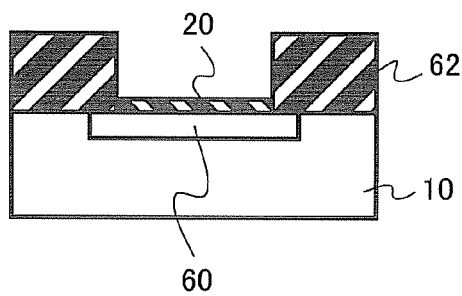
FIG. 27A to FIG. 27G are process sectional views illustrating a semiconductor device manufacturing method according to a modification of the twelfth embodiment.
Figure 27E:
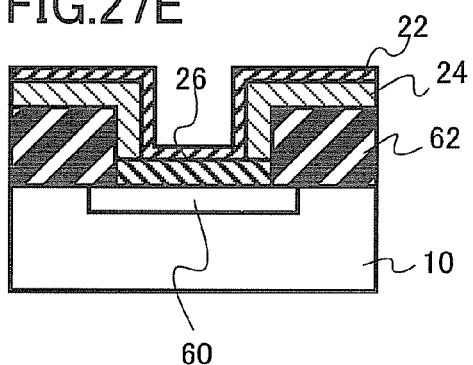
Figure 27B:
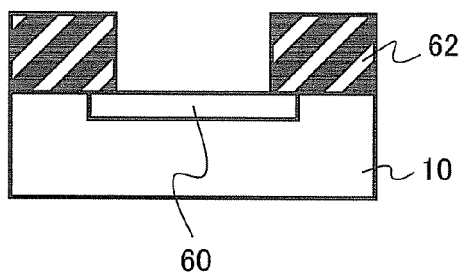
Figure 27F:
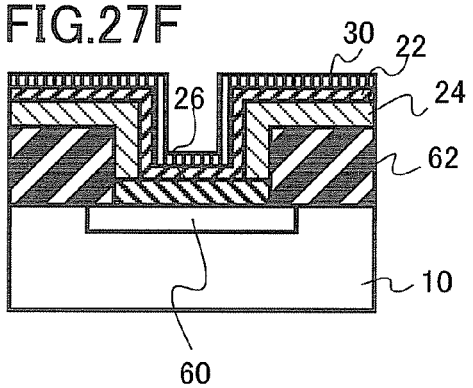
Figure 27C:
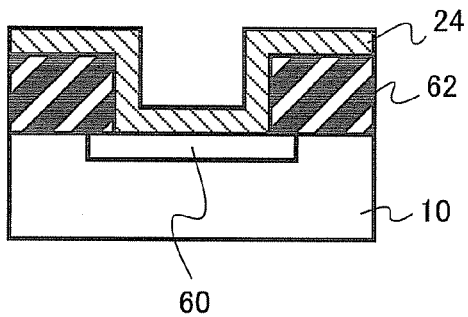
Figure 27G:
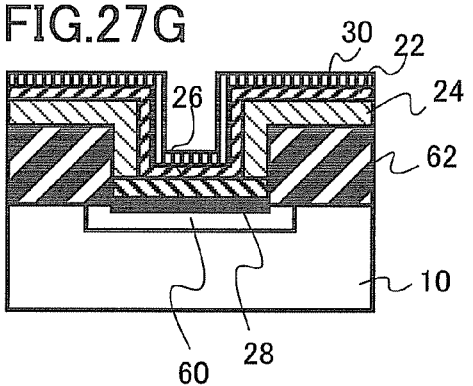
Figure 27D:
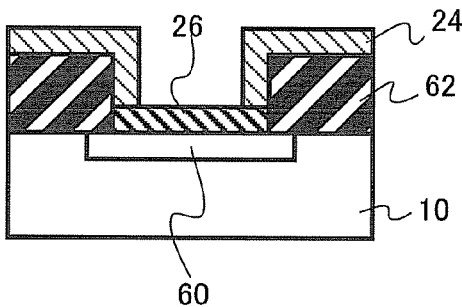

Then the second metal film 30 containing the second metal different from the first metal is deposited on the sulfur-containing film 22 (FIG. 27F). Then, for example, the second heat treatment is performed by the RTA (Rapid Thermal Annealing). The interface layer 28 to which the sulfur atoms are introduced is formed at the interface between the silicon substrate 10 and the suicide film 26 by the second heat treatment (FIG. 27G).

The second metal film 30 acts as a cap film that prevents the oxidation of sulfur in the sulfur-containing film 22 during the heat treatment and/or the outward diffusion of sulfur.

According to the modification of the twelfth embodiment, the contact resistance between the n-type semiconductor and the metal semiconductor compound can be reduced.

(Thirteenth Embodiment) A semiconductor device manufacturing method according to a thirteenth embodiment differs from that of the first embodiment in that the semiconductor device manufacturing method of the thirteenth embodiment is applied to not the formation of the drain electrode of the vertical power MOSFET, but the formation of a collector electrode of an npn bipolar transistor. Contents overlapping those of the first embodiment are partially omitted.

FIG. 28A to FIG. 28E are process sectional views illustrating the semiconductor device manufacturing method of the thirteenth embodiment.

For example, the p-type silicon (Si) substrate 10 is prepared.

Figure 28A:
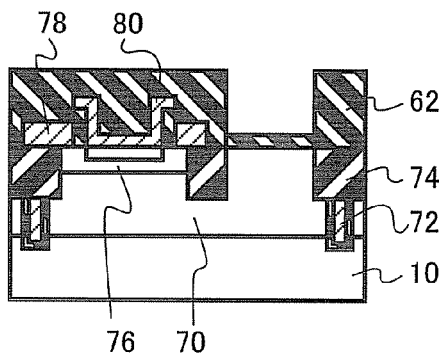
FIG. 28A to FIG. 28E are process sectional views illustrating a semiconductor device manufacturing method according to a thirteenth embodiment.

An n+-type collector region 70, a trench separation region 72, an element separation region 74, a p-type base region 76, a base electrode 78, and an emitter electrode 80 are formed on the upper surface of the silicon substrate 10 by a well-known manufacturing method. The interlayer insulator 62 and a contact hole in which the interlayer insulator 62 is opened in the n+-type collector region 70 are also formed. The oxide film 20 such as the native oxide film is formed on the n+-type source-drain region 50 (FIG. 28A).

Figure 28E:
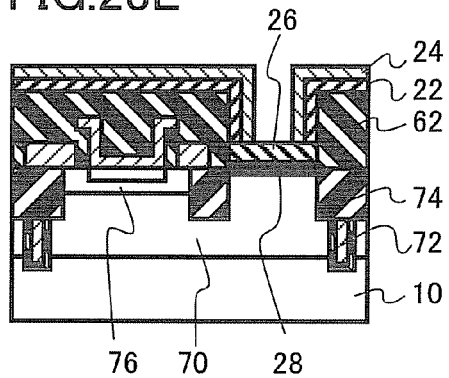
Figure 28B:
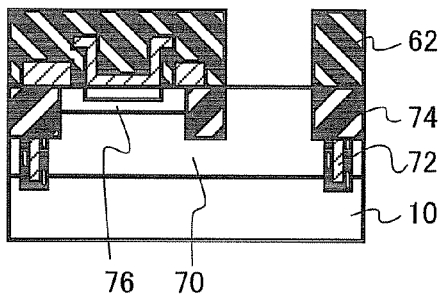

Then the oxide film 20 is removed by the etching (FIG. 28B).

Figure 28C:
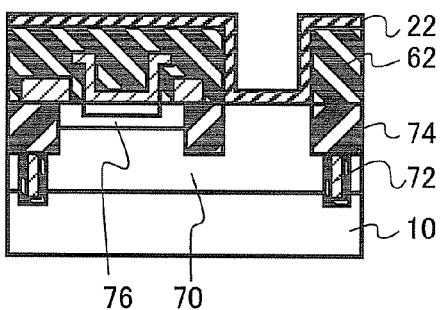

Then the sulfur-containing film 22 containing sulfur (S) is deposited (FIG. 28C).

Figure 28D:
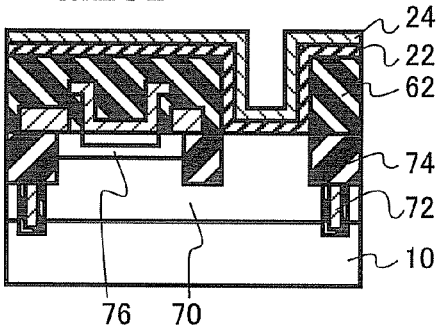

Then the first metal film 24 containing the first metal is deposited on the sulfur-containing film 22 (FIG. 28D).

Then, for example, the heat treatment is performed by the RTA (Rapid Thermal Annealing). The silicon substrate 10 is caused to react with the first metal film 24 to form the silicide film 26 by the heat treatment. The interface layer 28 to which the sulfur atoms are introduced is also formed at the interface between the silicon substrate 10 and the silicide film 26 by the heat treatment (FIG. 28E).

The silicide film 26 acts as the collector electrode of the npn bipolar transistor.

According to the semiconductor device manufacturing method of the thirteenth embodiment, the effect similar to that of the first embodiment is obtained for the formation of the metal semiconductor compound electrode. Accordingly, the high-reliability npn bipolar transistor having the high driving power is realized through the inexpensive process.

FIG. 29A to FIG. 29F are process sectional views illustrating a semiconductor device manufacturing method according to a modification of the thirteenth embodiment. The processes of the modification are similar to those of the thirteenth embodiment until the first metal film 24 containing the first metal is deposited on the sulfur-containing film 22 (FIG. 29A to FIG. 29D).

Figure 29A:
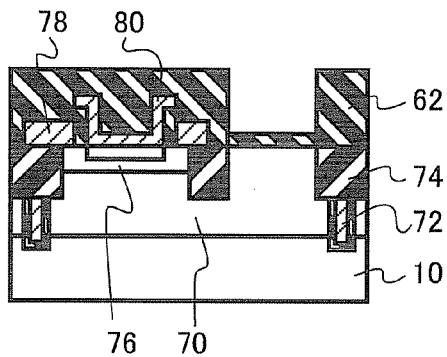
FIG. 29A to FIG. 29F are process sectional views illustrating a semiconductor device manufacturing method according to a modification of the thirteenth embodiment.
Figure 29B:
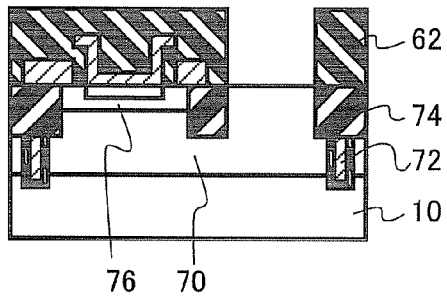
Figure 29C:
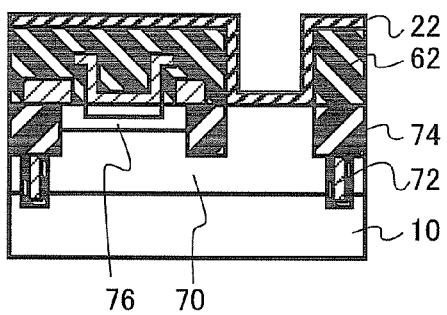
Figure 29D:
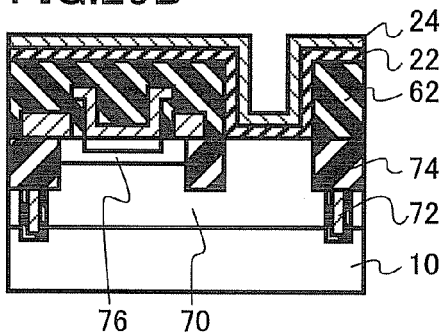
Figure 29E:
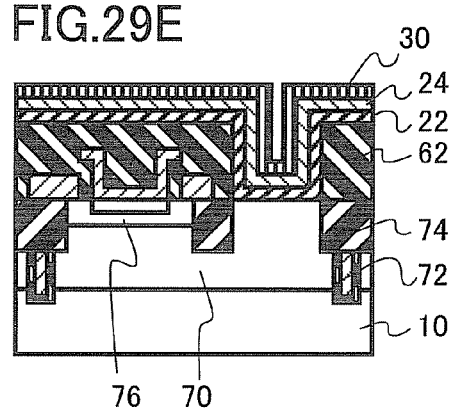

Then the second metal film 30 containing the second metal different from the first metal is deposited on the first metal film 24 (FIG. 29E).

Figure 29F:
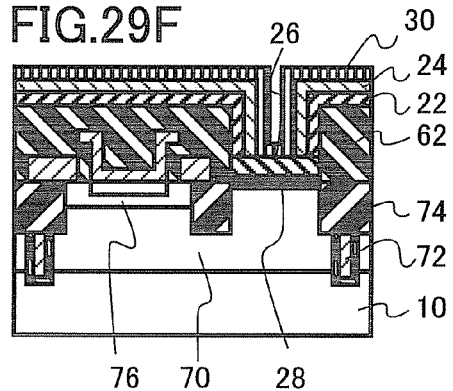

Then, for example, the heat treatment is performed by the RTA (Rapid Thermal Annealing). The silicon substrate 10 is caused to react with the first metal film 24 to form the silicide film 26 by the heat treatment. The interface layer 28 to which the sulfur atoms are introduced is also formed at the interface between the silicon substrate 10 and the silicide film 26 by the heat treatment (FIG. 29F).

The second metal film 30 acts as a cap film that prevents the oxidation of sulfur in the sulfur-containing film 22 during the heat treatment or the outward diffusion of sulfur.

According to the modification of the thirteenth embodiment, the contact resistance between the n-type semiconductor and the metal semiconductor compound can be reduced.

(Fourteenth Embodiment) A semiconductor device manufacturing method according to a fourteenth embodiment differs from that of the second embodiment in that the semiconductor device manufacturing method of the fourteenth embodiment is applied to not the formation of the drain electrode of the vertical power MOSFET, but the formation of the collector electrode of the npn bipolar transistor. Contents overlapping those of the second embodiment are partially omitted.

FIG. 30A to FIG. 30D are process sectional views illustrating the semiconductor device manufacturing method of the fourteenth embodiment.

For example, the p-type silicon (Si) substrate 10 is prepared.

Figure 30A:
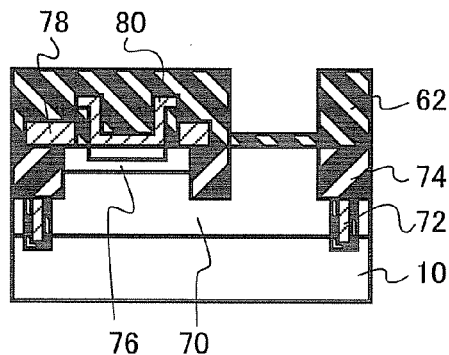
FIG. 30A to FIG. 30D are process sectional views illustrating a semiconductor device manufacturing method according to a fourteenth embodiment.

The n+-type collector region 70, the trench separation region 72, the element separation region 74, the p-type base region 76, the base electrode 78, and the emitter electrode 80 are formed on the upper surface of the silicon substrate 10 by the well-known manufacturing method. The interlayer insulator 62 and the contact hole in which the interlayer insulator 62 is opened in the n+-type collector region 70 are also formed. The oxide film 20 such as the native oxide film is formed on the n+-type source-drain region 50 (FIG. 30A).

Figure 30B:
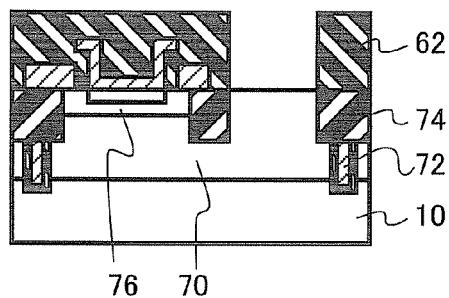

Then the oxide film 20 is removed by the etching (FIG. 30B).

Figure 30C:
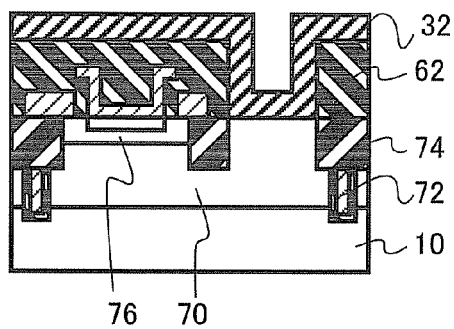

Then the sulfur-containing film 32 containing sulfur (S) and the first metal is deposited (FIG. 30C).

Figure 30D:
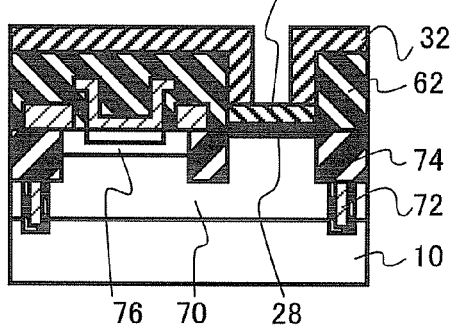

Then, for example, the heat treatment is performed by the RTA (Rapid Thermal Annealing). The silicon substrate 10 is caused to react with the sulfur-containing film 32 to form the silicide film 26 by the heat treatment. The interface layer 28 to which the sulfur atoms are introduced is also formed at the interface between the silicon substrate 10 and the silicide film 26 by the heat treatment (FIG. 30D).

The silicide film 26 acts as the collector electrode of the npn bipolar transistor.

According to the semiconductor device manufacturing method of the fourteenth embodiment, the effect similar to that of the second embodiment is obtained for the formation of the metal semiconductor compound electrode. Accordingly, the high-reliability npn bipolar transistor having the high driving power is realized through the inexpensive process.

Figure 31A:
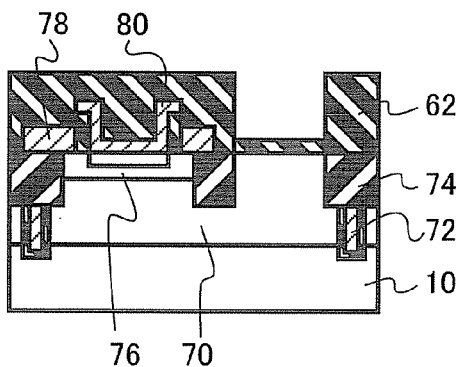
FIG. 31A to FIG. 31E are process sectional views illustrating a semiconductor device manufacturing method according to a modification of the fourteenth embodiment.
Figure 31E:
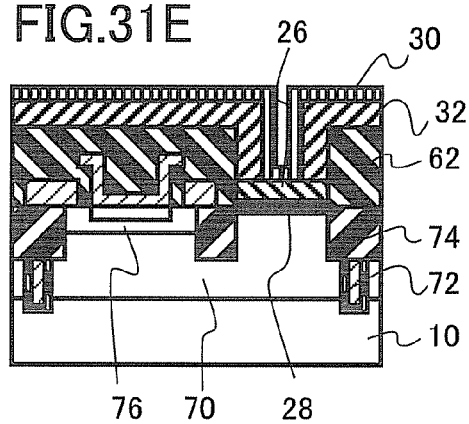
Figure 31B:
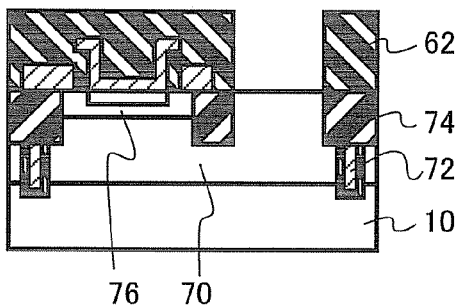
Figure 31C:
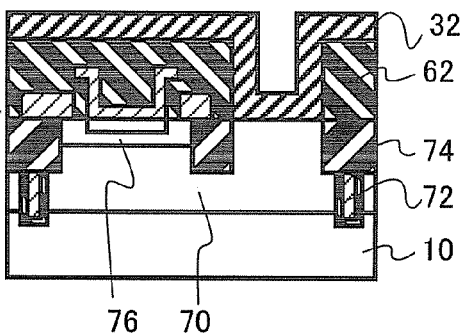

FIG. 31A to FIG. 31E are process sectional views illustrating a semiconductor device manufacturing method according to a modification of the fourteenth embodiment. The processes of the modification are similar to those of the fourteenth embodiment until the sulfur-containing film 32 is deposited (FIG. 31A to FIG. 31C).

Figure 31D:
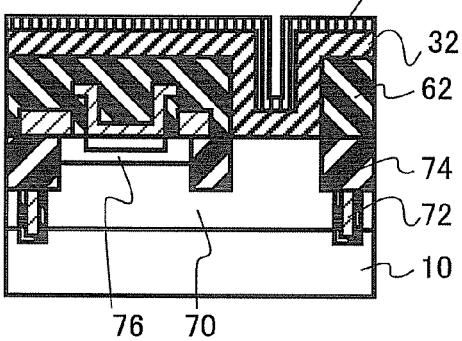

Then the second metal film 30 containing the second metal different from the first metal is deposited on the sulfur-containing film 32 (FIG. 31D). Then, for example, the heat treatment is performed by the RTA (Rapid Thermal Annealing). The silicon substrate 10 is caused to react with the sulfur-containing film 32 to form the silicide film 26 by the heat treatment. The interface layer 28 to which the sulfur atoms are introduced is also formed at the interface between the silicon substrate 10 and the silicide film 26 by the heat treatment (FIG. 31E).

The second metal film 30 acts as a cap film that prevents the oxidation of sulfur in the sulfur-containing film 22 during the heat treatment and/or the outward diffusion of sulfur.

According to the modification of the fourteenth embodiment, the contact resistance between the n-type semiconductor and the metal semiconductor compound can be reduced.

(Fifteenth Embodiment) A semiconductor device manufacturing method according to a fifteenth embodiment differs from that of the third embodiment in that the semiconductor device manufacturing method of the fifteenth embodiment is applied to not the formation of the drain electrode of the vertical power MOSFET, but the formation of the collector electrode of the npn bipolar transistor. Contents overlapping those of the third embodiment are partially omitted.

FIG. 32A to FIG. 32F are process sectional views illustrating the semiconductor device manufacturing method of the fifteenth embodiment.

For example, the p-type silicon (Si) substrate 10 is prepared.

Figure 32A:
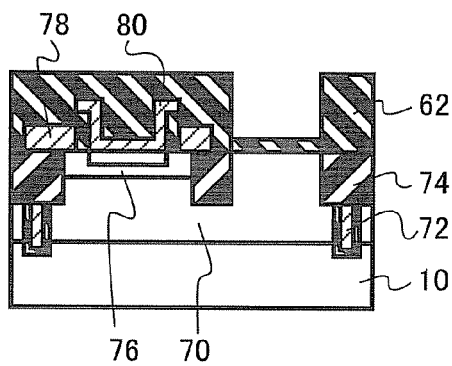
FIG. 32A to FIG. 32F are process sectional views illustrating a semiconductor device manufacturing method according to a fifteenth embodiment.

The n+-type collector region 70, the trench separation region 72, the element separation region 74, the p-type base region 76, the base electrode 78, and the emitter electrode 80 are formed on the upper surface of the silicon substrate 10 by the well-known manufacturing method. The interlayer insulator 62 and the contact hole in which the interlayer insulator 62 is opened in the n+-type collector region 70 are also formed. The oxide film 20 such as the native oxide film is formed on the n+-type source-drain region 50 (FIG. 32A).

Figure 32E:
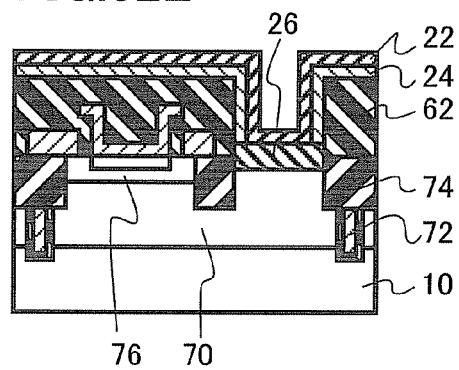
Figure 32B:
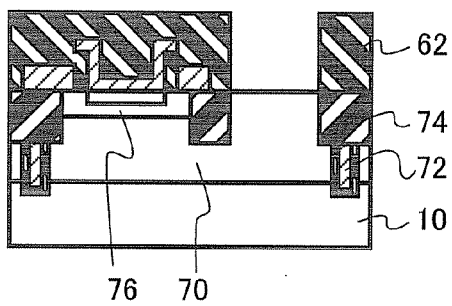

Then the oxide film 20 is removed by the etching (FIG. 32B).

Figure 32F:
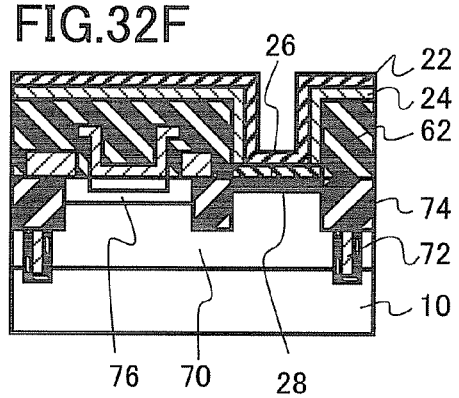
Figure 32C:
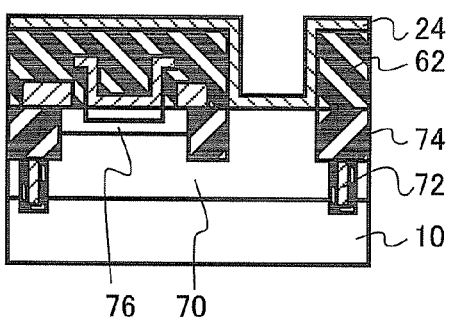

Then the first metal film 24 containing the first metal is deposited (FIG. 32C).

Figure 32D:
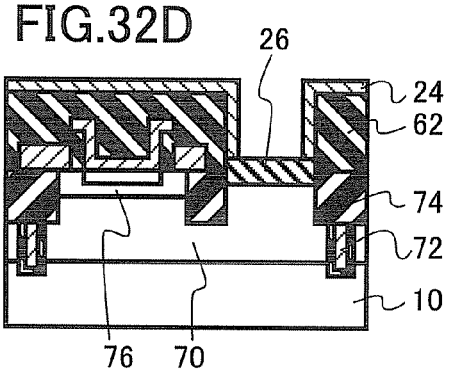

Then, for example, the first heat treatment is performed by the RTA (Rapid Thermal Annealing). The silicon substrate 10 is caused to react with the first metal film 24 to form the silicide film 26 by the first heat treatment (FIG. 32D).

Then the sulfur-containing film 22 containing sulfur (S) is deposited on the silicide film 26 (FIG. 32E).

Then, for example, the second heat treatment is performed by the RTA (Rapid Thermal Annealing). The interface layer 28 to which the sulfur atoms are introduced is formed at the interface between the silicon substrate 10 and the silicide film 26 by the second heat treatment (FIG. 32F).

The silicide film 26 acts as the collector electrode of the npn bipolar transistor.

According to the semiconductor device manufacturing method of the fourteenth embodiment, the effect similar to that of the third embodiment is obtained for the formation of the metal semiconductor compound electrode. Accordingly, the high-reliability npn bipolar transistor having the high driving power is realized through the inexpensive process.

FIG. 33A to FIG. 33G are process sectional views illustrating a semiconductor device manufacturing method according to a modification of the fifteenth embodiment. The processes of the modification are similar to those of the fifteenth embodiment until the sulfur-containing film 22 is deposited on the first metal film 24 (FIG. 33A to FIG. 33E).

Figure 33A:
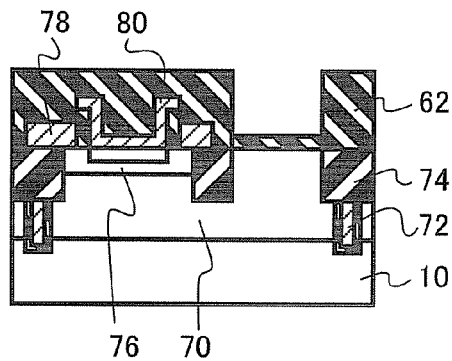
FIG. 33A to FIG. 33G are process sectional views illustrating a semiconductor device manufacturing method according to a modification of the fifteenth embodiment.
Figure 33E:
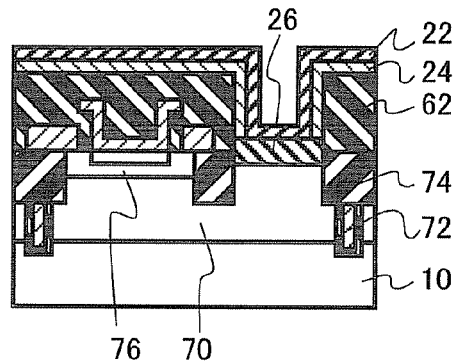
Figure 33B:
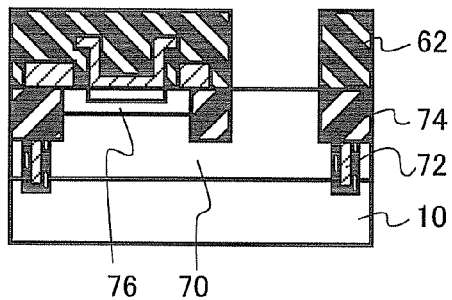
Figure 33F:
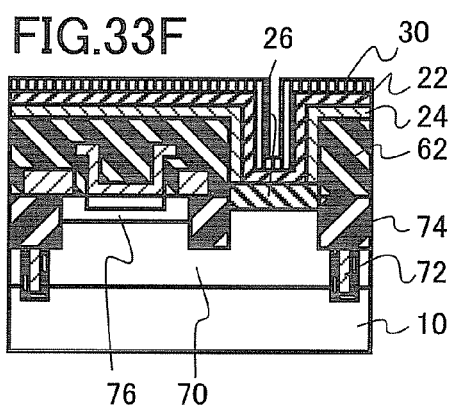
Figure 33C:
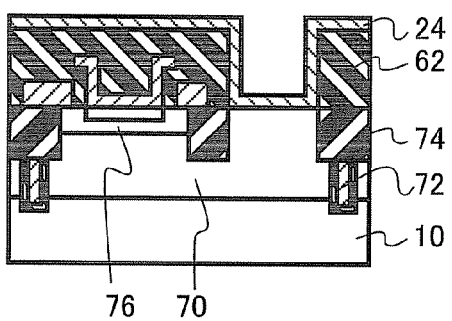
Figure 33G:
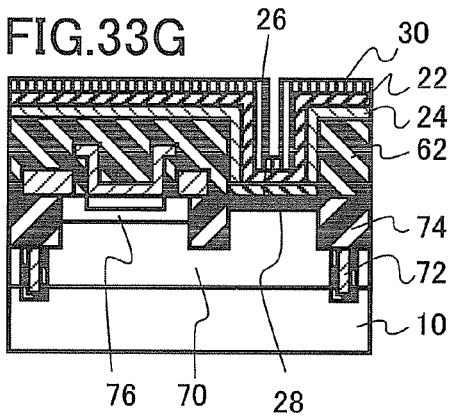
Figure 33D:
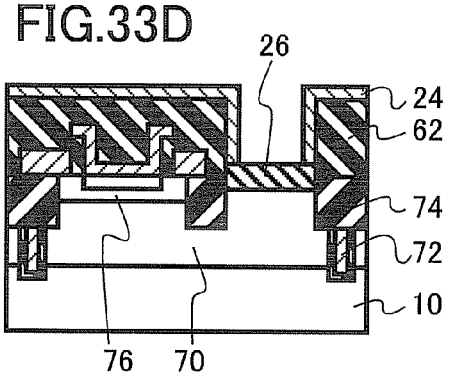

Then the second metal film 30 containing the second metal different from the first metal is deposited on the sulfur-containing film 22 (FIG. 33F). Then, for example, the second heat treatment is performed by the RTA (Rapid Thermal Annealing). The interface layer 28 to which the sulfur atoms are introduced is formed at the interface between the silicon substrate 10 and the silicide film 26 by the second heat treatment (FIG. 33G).

The second metal film 30 acts as a cap film that prevents the oxidation of sulfur in the sulfur-containing film 22 during the heat treatment or the outward diffusion of sulfur.

According to the modification of the fifteenth embodiment, the contact resistance between the n-type semiconductor and the metal semiconductor compound can be reduced.

While certain embodiments have been described, these embodiments have been presented by way of example only, and are not intended to limit the scope of the inventions. Indeed, the semiconductor device manufacturing method described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

For example, in the embodiments, the n-type silicon is used as the n-type semiconductor. Alternatively, for example, the invention may be applied to an n-type silicon carbide (SiC).

What is claimed is:

1. A semiconductor device manufacturing method comprising:
   depositing a sulfur-containing film on an n-type semiconductor;
   depositing a first metal film containing a first metal on the sulfur-containing film; and
   performing a heat treatment to form a metal semiconductor compound film by reacting the n-type semiconductor and the first metal film, and to introduce sulfur in the sulfur-containing film to an interface between the n-type semiconductor and the metal semiconductor compound film being formed,
   wherein the depositing the sulfur-containing film is performed by a sputtering method using nickel sulfide as a target.

2. The method according to claim 1, wherein the first metal is one of nickel, titanium, and cobalt.

3. The method according to claim 1, further comprising depositing a second metal film containing a second metal different from the first metal on the first metal film before performing the heat treatment.

4. The method according to claim 3, wherein the second metal is one of vanadium, molybdenum, titanium, zirconium, hafnium, tantalum, niobium, and a titanium nitride.

5. The method according to claim 1, wherein the n-type semiconductor has an n-type impurity concentration of $3 \times 10^{18}$ cm$^{-3}$ or less.

6. The method according to claim 1, wherein the metal semiconductor compound film is a drain electrode of a vertical power MOSFET.

7. A semiconductor device manufacturing method comprising:
   depositing a sulfur-containing film containing sulfur and a first metal on an n-type semiconductor; and
   performing a heat treatment to form a metal semiconductor compound film by reacting the n-type semiconductor and the sulfur-containing film, and to introduce sulfur in the sulfur-containing film to an interface between the n-type semiconductor and the metal semiconductor compound film being formed,
   wherein the depositing the sulfur-containing film is performed by a sputtering method using nickel sulfide as a target.

8. The method according to claim 7, further comprising depositing a metal film containing a second metal different from the first metal on the first metal sulfur-containing film before the performing the heat treatment.

9. The method according to claim 8, wherein the second metal is one of vanadium, molybdenum, titanium, zirconium, hafnium, tantalum, niobium, and a titanium nitride.

10. The method according to claim 7, wherein the n-type semiconductor has an n-type impurity concentration of $3\times10^{18}$ cm$^{-3}$ or less.

11. The method according to claim 7, wherein the metal semiconductor compound film is a drain electrode of a vertical power MOSFET.

12. A semiconductor device manufacturing method comprising:
depositing a first metal film containing a first metal on an n-type semiconductor;
performing a first heat treatment to form a metal semiconductor compound film by reacting the n-type semiconductor and the first metal film;
depositing a sulfur-containing film on the metal semiconductor compound film; and
performing a second heat treatment to introduce sulfur in the sulfur-containing film to an interface between the n-type semiconductor and the metal semiconductor compound film,
wherein the depositing the sulfur-containing film is performed by a sputtering method using nickel sulfide as a target.

13. The method according to claim 12, wherein the first metal is one of nickel, titanium, and cobalt.

14. The method according to claim 12, further comprising depositing a second metal film containing a second metal different from the first metal on the first metal sulfur-containing film before performing the second heat treatment.

15. The method according to claim 14, wherein the second metal is one of vanadium, molybdenum, titanium, zirconium, hafnium, tantalum, niobium, and a titanium nitride.

16. The method according to claim 12, wherein the n-type semiconductor has an n-type impurity concentration of $3\times10^{18}$ cm$^{-3}$ or less.

17. A semiconductor device manufacturing method comprising:
depositing a sulfur-containing film on an n-type semiconductor;
depositing a first metal film containing a first metal on the sulfur-containing film;
depositing a second metal film containing a second metal different from the first metal on the first metal film; and
performing a heat treatment to form a metal semiconductor compound film by reacting the n-type semiconductor and the first metal film, and to introduce sulfur in the sulfur-containing film to an interface between the n-type semiconductor and the metal semiconductor compound film being formed.

18. A semiconductor device manufacturing method comprising:
depositing a sulfur-containing film containing sulfur and a first metal on an n-type semiconductor;
depositing a metal film containing a second metal different from the first metal on the sulfur-containing film; and
performing a heat treatment to form a metal semiconductor compound film by reacting the n-type semiconductor and the sulfur-containing film, and to introduce sulfur in the sulfur-containing film to an interface between the n-type semiconductor and the metal semiconductor compound film being formed.

19. A semiconductor device manufacturing method comprising:
depositing a first metal film containing a first metal on an n-type semiconductor;
performing a first heat treatment to form a metal semiconductor compound film by reacting the n-type semiconductor and the first metal film;
depositing a sulfur-containing film on the metal semiconductor compound film;
depositing a second metal film containing a second metal different from the first metal on the sulfur-containing film; and
performing a second heat treatment to introduce sulfur in the sulfur-containing film to an interface between the n-type semiconductor and the metal semiconductor compound film.

* * * * *